(12) United States Patent
Natarajan et al.

(10) Patent No.: US 7,746,537 B2
(45) Date of Patent: Jun. 29, 2010

(54) MEMS DEVICES AND PROCESSES FOR PACKAGING SUCH DEVICES

(75) Inventors: Bangalore R. Natarajan, Cupertino, CA (US); Surya Ganti, Los Altos, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 143 days.

(21) Appl. No.: 11/734,730

(22) Filed: Apr. 12, 2007

(65) Prior Publication Data

US 2007/0242341 A1  Oct. 18, 2007

Related U.S. Application Data

(60) Provisional application No. 60/791,730, filed on Apr. 13, 2006.

(51) Int. Cl.
G02B 26/00 (2006.01)
(52) U.S. Cl. ...................... 359/290; 359/292
(58) Field of Classification Search ............ 359/290, 359/291, 292, 295, 298, 220, 222, 230, 324; 310/309, 310; 438/50, 51, 53, 55, 106, 125, 438/126; 257/522
See application file for complete search history.

(56) References Cited

U.S. PATENT DOCUMENTS

| | | | |
|---|---|---|---|
| 4,036,360 A | 7/1977 | Deffeyes | |
| 4,074,480 A | 2/1978 | Burton | |
| 4,310,220 A | 1/1982 | Kuwagaki et al. | |
| 4,383,255 A | 5/1983 | Grandjean et al. | |
| 4,459,182 A | 7/1984 | te Velde | |
| 4,531,126 A | 7/1985 | Sadones | |
| 4,844,614 A | 7/1989 | Henderson et al. | |
| 4,956,619 A | 9/1990 | Hornbeck | |
| 5,018,256 A | 5/1991 | Hornbeck | |
| 5,099,353 A | 3/1992 | Hornbeck | |
| 5,216,537 A | 6/1993 | Hornbeck | |
| 5,244,707 A | 9/1993 | Shores | |
| 5,268,533 A | 12/1993 | Kovacs et al. | |
| 5,304,419 A | 4/1994 | Shores | |

(Continued)

FOREIGN PATENT DOCUMENTS

CN   1449990   10/2003

(Continued)

OTHER PUBLICATIONS

Keusseyan et al., A new approach for opto-electronic/MEMS packaging, Proceedings 52nd Electronic Components and Technology Conference, ECTC May 2002, pp. 259-262.

(Continued)

*Primary Examiner*—Ricky L Mack
*Assistant Examiner*—Tuyen Q Tra
(74) *Attorney, Agent, or Firm*—Knobbe Martens Olson & Bear LLP

(57) ABSTRACT

A package structure and method of packaging for a MEMS device is described. A transparent substrate having an interferometric modulator array formed thereon is shown. A single or dual-layered backplate is joined to the transparent substrate with a seal. The interferometric modulator array may be exposed to the surrounding environment through an opening in either the backplate or the seal.

25 Claims, 19 Drawing Sheets

U.S. PATENT DOCUMENTS

| | | |
|---|---|---|
| 5,331,454 A | 7/1994 | Hornbeck |
| 5,401,983 A | 3/1995 | Jokerst et al. |
| 5,591,379 A | 1/1997 | Shores |
| 5,610,438 A | 3/1997 | Wallace et al. |
| 5,614,785 A | 3/1997 | Wallace et al. |
| 5,717,476 A | 2/1998 | Kanezawa |
| 5,771,321 A | 6/1998 | Stern |
| 5,784,189 A | 7/1998 | Bozler et al. |
| 5,835,255 A | 11/1998 | Miles |
| 5,837,562 A | 11/1998 | Cho |
| 5,853,662 A | 12/1998 | Watanabe |
| 5,856,820 A | 1/1999 | Weigers et al. |
| 5,882,761 A | 3/1999 | Kawami et al. |
| 5,936,758 A | 8/1999 | Fisher et al. |
| 5,939,785 A | 8/1999 | Klonis et al. |
| 5,959,763 A | 9/1999 | Bozler et al. |
| 5,986,796 A | 11/1999 | Miles |
| 5,999,306 A | 12/1999 | Atobe et al. |
| 6,040,937 A | 3/2000 | Miles |
| 6,055,090 A | 4/2000 | Miles |
| 6,107,115 A | 8/2000 | Atobe et al. |
| 6,120,339 A | 9/2000 | Alwan |
| 6,127,765 A | 10/2000 | Fushinobu |
| 6,195,196 B1 | 2/2001 | Kimura et al. |
| 6,238,755 B1 | 5/2001 | Harvey et al. |
| 6,261,853 B1 | 7/2001 | Howell et al. |
| 6,303,986 B1 | 10/2001 | Shook |
| 6,365,229 B1 | 4/2002 | Robbins |
| 6,379,988 B1 | 4/2002 | Peterson et al. |
| 6,426,124 B2 | 7/2002 | Olster et al. |
| 6,426,461 B1 | 7/2002 | Ginter et al. |
| 6,445,062 B1 | 9/2002 | Honda |
| 6,447,126 B1 | 9/2002 | Hornbeck |
| 6,455,927 B1 | 9/2002 | Glenn et al. |
| 6,462,392 B1 | 10/2002 | Pinter et al. |
| 6,465,355 B1 | 10/2002 | Horsley |
| 6,466,354 B1 | 10/2002 | Gudeman |
| 6,472,739 B1 | 10/2002 | Wood et al. |
| 6,489,670 B1 | 12/2002 | Peterson et al. |
| 6,495,895 B1 | 12/2002 | Peterson et al. |
| 6,507,385 B1 | 1/2003 | Nishiyama et al. |
| 6,525,416 B2 | 2/2003 | Hauser et al. |
| 6,538,312 B1 | 3/2003 | Peterson et al. |
| 6,558,820 B2 | 5/2003 | Raychaudhuri et al. |
| 6,583,921 B2 | 6/2003 | Nelson |
| 6,589,625 B1 | 7/2003 | Kothari et al. |
| 6,603,182 B1 | 8/2003 | Low et al. |
| 6,650,455 B2 | 11/2003 | Miles |
| 6,661,084 B1 | 12/2003 | Peterson et al. |
| 6,674,159 B1 | 1/2004 | Peterson et al. |
| 6,674,562 B1 | 1/2004 | Miles et al. |
| 6,680,792 B2 | 1/2004 | Miles |
| 6,690,444 B1 | 2/2004 | Wilkinson et al. |
| 6,743,656 B2 | 6/2004 | Orcutt et al. |
| 6,778,046 B2 | 8/2004 | Stafford et al. |
| 6,779,260 B1 | 8/2004 | Brandenburg et al. |
| 6,791,660 B1 | 9/2004 | Hayashi et al. |
| 6,833,668 B1 | 12/2004 | Yamada et al. |
| 6,838,309 B1 | 1/2005 | McCann |
| 6,843,936 B1 | 1/2005 | Jacobs |
| 6,867,896 B2 | 3/2005 | Miles |
| 6,872,984 B1 | 3/2005 | Leung |
| 6,882,458 B2 | 4/2005 | Lin et al. |
| 6,882,480 B2 | 4/2005 | Yanagisawa |
| 6,914,245 B2 | 7/2005 | Sone et al. |
| 6,947,200 B2 | 9/2005 | Huibers |
| 6,995,890 B2 | 2/2006 | Lin |
| 6,999,225 B2 | 2/2006 | Lin et al. |
| 7,015,885 B2 | 3/2006 | Novotny et al. |
| 7,019,458 B2 | 3/2006 | Yoneda |
| 7,034,984 B2 | 4/2006 | Pan et al. |
| 7,042,643 B2 | 5/2006 | Miles |
| 7,046,374 B1 | 5/2006 | Barbarossa |
| 7,060,895 B2 | 6/2006 | Kothari et al. |
| 7,123,216 B1 | 10/2006 | Miles |
| 7,126,741 B2 | 10/2006 | Wagner et al. |
| 7,161,728 B2 | 1/2007 | Sampsell et al. |
| 7,164,520 B2 | 1/2007 | Palmateer et al. |
| 7,184,202 B2 | 2/2007 | Miles et al. |
| 7,218,438 B2 * | 5/2007 | Przybyla et al. ............. 359/290 |
| 7,259,449 B2 | 8/2007 | Floyd |
| 7,282,393 B2 | 10/2007 | Tarn |
| 7,307,776 B2 | 12/2007 | Miles et al. |
| 7,456,497 B2 | 11/2008 | Higashi |
| 7,517,712 B2 | 4/2009 | Stark |
| 7,518,775 B2 * | 4/2009 | Miles et al. ................. 359/238 |
| 2001/0004085 A1 | 6/2001 | Gueissaz |
| 2001/0055146 A1 | 12/2001 | Atobe et al. |
| 2002/0012364 A1 | 1/2002 | Kalian et al. |
| 2002/0043706 A1 | 4/2002 | Jerominek et al. |
| 2002/0052392 A1 | 5/2002 | Day et al. |
| 2002/0056898 A1 | 5/2002 | Lopes et al. |
| 2002/0056900 A1 | 5/2002 | Liu et al. |
| 2002/0057565 A1 | 5/2002 | Seo |
| 2002/0063322 A1 | 5/2002 | Robbins et al. |
| 2002/0070931 A1 | 6/2002 | Ishikawa |
| 2002/0075551 A1 | 6/2002 | Daneman |
| 2002/0075555 A1 | 6/2002 | Miles |
| 2002/0119724 A1 | 8/2002 | Hammel |
| 2002/0126364 A1 | 9/2002 | Miles |
| 2002/0149096 A1 | 10/2002 | Liebeskind |
| 2002/0160583 A1 | 10/2002 | Song |
| 2002/0187254 A1 | 12/2002 | Ghosh |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0075794 A1 | 4/2003 | Felton et al. |
| 2003/0103185 A1 | 6/2003 | Kim et al. |
| 2003/0108306 A1 | 6/2003 | Whitney et al. |
| 2003/0121418 A1 | 7/2003 | Loop et al. |
| 2003/0122137 A1 | 7/2003 | Hashimoto |
| 2003/0138656 A1 | 7/2003 | Sparks |
| 2003/0144034 A1 | 7/2003 | Hack et al. |
| 2003/0152872 A1 | 8/2003 | Miles |
| 2003/0160021 A1 | 8/2003 | Platt et al. |
| 2003/0161126 A1 | 8/2003 | Wilkinson et al. |
| 2003/0184412 A1 | 10/2003 | Gorrell |
| 2004/0051929 A1 | 3/2004 | Sampsell et al. |
| 2004/0061492 A1 | 4/2004 | Lopes et al. |
| 2004/0066258 A1 | 4/2004 | Cohn et al. |
| 2004/0076008 A1 | 4/2004 | Ikeda |
| 2004/0100677 A1 | 5/2004 | Huibers et al. |
| 2004/0122175 A1 | 6/2004 | Hekal |
| 2004/0140557 A1 | 7/2004 | Sun et al. |
| 2004/0150319 A1 | 8/2004 | Tomimatsu et al. |
| 2004/0163472 A1 | 8/2004 | Nagahara |
| 2004/0166603 A1 | 8/2004 | Carley |
| 2004/0173886 A1 | 9/2004 | Carley |
| 2004/0183990 A1 | 9/2004 | Guang et al. |
| 2004/0184133 A1 | 9/2004 | Su et al. |
| 2004/0189195 A1 | 9/2004 | Allemand |
| 2004/0213962 A1 | 10/2004 | Bourdelais et al. |
| 2004/0218251 A1 | 11/2004 | Piehl et al. |
| 2004/0259370 A1 | 12/2004 | Bergman |
| 2005/0002079 A1 | 1/2005 | Novotny et al. |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0042117 A1 | 2/2005 | Lin |
| 2005/0046919 A1 | 3/2005 | Taguchi et al. |
| 2005/0074919 A1 | 4/2005 | Patel et al. |
| 2005/0093134 A1 | 5/2005 | Tarn |
| 2005/0116924 A1 | 6/2005 | Sauvante et al. |

| | | | | | |
|---|---|---|---|---|---|
| 2005/0159028 A1 | 7/2005 | Sweetland et al. | JP | 2002-357846 | 12/2002 |
| 2005/0167795 A1 | 8/2005 | Higashi | JP | 2003-075741 | 3/2003 |
| 2005/0184304 A1 | 8/2005 | Gupta et al. | JP | 2003-217828 | 7/2003 |
| 2005/0195462 A1 | 9/2005 | Lin | JP | 2003-233024 | 8/2003 |
| 2005/0247477 A1 | 11/2005 | Kothari et al. | JP | 2003-330001 | 11/2003 |
| 2005/0253283 A1 | 11/2005 | Dcamp et al. | JP | 2004-053852 | 2/2004 |
| 2005/0254982 A1 | 12/2005 | Cadeddu | JP | 2004-78107 | 3/2004 |
| 2006/0029732 A1 | 2/2006 | Kobrin et al. | JP | 2004-118001 | 4/2004 |
| 2006/0065436 A1 | 3/2006 | Gally et al. | WO | WO 90/05795 | 5/1990 |
| 2006/0066600 A1 | 3/2006 | Palmateer | WO | WO 90/05795 | 1/1995 |
| 2006/0066935 A1 | 3/2006 | Cummings et al. | WO | WO 98/06118 | 2/1998 |
| 2006/0067641 A1 | 3/2006 | Palmateer et al. | WO | WO 00/16105 | 3/2000 |
| 2006/0067642 A1 | 3/2006 | Tyger | WO | WO 00/17695 | 3/2000 |
| 2006/0076631 A1 | 4/2006 | Palmateer et al. | WO | WO 01/45140 | 6/2001 |
| 2006/0076632 A1 | 4/2006 | Palmateer et al. | WO | WO 01/58804 | 8/2001 |
| 2006/0076634 A1 | 4/2006 | Palmateer et al. | WO | WO 02/39513 | 5/2002 |
| 2006/0076637 A1* | 4/2006 | Gally et al. .......... 257/433 | WO | WO 02/42716 | 5/2002 |
| 2006/0076648 A1 | 4/2006 | Gally et al. | WO | WO 03/009317 | 1/2003 |
| 2006/0077126 A1 | 4/2006 | Kothari | WO | WO 03/023849 | 3/2003 |
| 2006/0077145 A1 | 4/2006 | Floyd | WO | WO 03/026369 | 3/2003 |
| 2006/0077146 A1 | 4/2006 | Palmateer | WO | WO 03/054925 | 3/2003 |
| 2006/0077147 A1 | 4/2006 | Palmateer et al. | WO | WO 03/070625 | 8/2003 |
| 2006/0077150 A1 | 4/2006 | Sampsell | WO | WO 03/084861 | 10/2003 |
| 2006/0077503 A1 | 4/2006 | Palmateer et al. | WO | WO 03/095706 | 11/2003 |
| 2006/0077524 A1 | 4/2006 | Palmateer | WO | WO 03/105198 | 12/2003 |
| 2006/0148365 A1 | 7/2006 | Tsai | WO | WO 2004/025727 | 3/2004 |
| 2006/0197215 A1 | 9/2006 | Potter | WO | WO 2004/077523 | 9/2004 |
| 2006/0214569 A1 | 9/2006 | Ohshita et al. | | | |
| 2006/0274400 A1 | 12/2006 | Miles | | | |
| 2007/0170568 A1 | 7/2007 | Palmateer et al. | | | |
| 2007/0247693 A1 | 10/2007 | Miles et al. | | | |
| 2008/0112036 A1 | 5/2008 | Cummings | | | |
| 2008/0164544 A1 | 7/2008 | Palmateer et al. | | | |
| 2009/0059342 A1 | 3/2009 | Palmateer et al. | | | |
| 2009/0103167 A1 | 4/2009 | Tsai | | | |
| 2009/0219605 A1 | 9/2009 | Lin et al. | | | |
| 2009/0257109 A1 | 10/2009 | Miles et al. | | | |

FOREIGN PATENT DOCUMENTS

| | | |
|---|---|---|
| EP | 0 695 959 | 2/1996 |
| EP | 0 822 570 | 2/1998 |
| EP | 0 969 700 | 1/2000 |
| EP | 1 251 546 | 10/2002 |
| EP | 1418154 A2 | 5/2004 |
| EP | 1 433 742 | 6/2004 |
| EP | 1 640 320 | 3/2006 |
| EP | 1 640 337 | 3/2006 |
| EP | 1 640 772 | 3/2006 |
| EP | 1 640 775 | 3/2006 |
| FR | 2841380 | 12/2003 |
| JP | 61-206244 | 9/1986 |
| JP | 63-162378 | 10/1988 |
| JP | 10-070287 | 3/1998 |
| JP | 10-70287 | 3/1998 |
| JP | 08-162006 | 6/1998 |
| JP | 11 337953 | 12/1999 |
| JP | 2001-318324 | 11/2001 |
| JP | 2001-351998 | 12/2001 |
| JP | 2002-062491 | 2/2002 |
| JP | 2002-062492 | 2/2002 |
| JP | 2002-258310 | 9/2002 |
| JP | 2002-296519 | 10/2002 |
| JP | 2002-312066 | 10/2002 |
| JP | 2002-328313 | 11/2002 |

OTHER PUBLICATIONS

Miles, MEMS-based interferometric modulator for display applications, Proceedings of the SPIE, Micromachined Devices and Components V, Sep. 1999, pp. 20-28.

Previti et al., Getters: micromolecular scavengers for packaging, Proceedings International Symposium on Advanced Packaging Materials Processes, Properties and Interfaces, 2001, pp. 201-206.

Stark et al., An integrated process for post-packaging release and vacuum sealing of electroplated nickel packages, Transducers, 12th International Conference on Solid-State Sensors, Actuators and Microsystems, 2003, pp. 1911-1914.

Invitation to Pay Additional Fees for PCT/US07/009271 filed Apr. 12, 2007.

ISR and WO for PCT/US07/009275 filed Apr. 12, 2007.

Greco et al., Optical properties of IPN-like networks polyethylene/poly(butylmethacrylate-co-styrene copolymer systems, III. Influence of copolymer crosslinkers, Polymer 42 (2001), 5089-5095.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Office Action dated Sep. 17, 2008 in U.S. Appl. No. 11/735,362.

Tilmans et al., The indent reflow sealing (IRS) technique-A method for the fabrication of sealed cavities for mems devices, Journal of Microelectromechanical Systems, 9(2), Jun. 2000.

ISR and WO for PCT/US07/009271 filed Apr. 12, 2007.

IPRP for PCT/US07/009271 filed Apr. 12, 2007.

IPRP for PCT/US071009275 filed Apr. 12, 2007.

Office Action dated Jan. 29, 2009 in U.S. Appl. No. 11/735,362.

Office Action dated Jul. 6, 2009 in U.S. Appl. No. 11/735,362.

* cited by examiner

|  | +$V_{bias}$ | -$V_{bias}$ |
|---|---|---|
| 0 | Stable | Stable |
| +ΔV | Relax | Actuate |
| −ΔV | Actuate | Relax |

Column Output Signals

Row Output Signals

MEMS DEVICES AND PROCESSES FOR PACKAGING SUCH DEVICES

CROSS REFERENCE TO RELATED APPLICATIONS

This application claims priority to U.S. Provisional Application No. 60/791,730, titled "MEMS Devices and Processes for Packaging Such Devices," filed Apr. 13, 2006, which is hereby incorporated by reference, in its entirety.

BACKGROUND

1. Field of the Invention

The field of the invention relates to microelectromechanical systems (MEMS). More specifically, the invention relates to MEMS devices having an electrical contact, electrode interconnect structures. One particular application can be found in capacitive MEMS devices. Finally, due to the (semi)-transparent nature of the electrode material in visible light, the invention also relates to optical MEMS devices, in general, and interferometric light modulators in particular.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

One embodiment is a method of manufacturing a microelectromechanical systems (MEMS) based display device. This method includes providing a transparent substrate comprising at least one MEMS device formed thereon; providing a first backplate comprising at least one orifice; providing a second backplate comprising at least one desiccant area; and forming a MEMS package wherein the transparent substrate is joined to the first backplate, and the first backplate is joined to the second backplate. Another embodiment is a display device made by this method.

Another embodiment is a microelectromechanical systems based device that includes: a transparent substrate having a microelectromechanical system (MEMS) device formed thereon; a first backplate comprising at least one orifice; and a second backplate joined to the first backplate, and comprising at least one desiccant area, wherein the at least one desiccant area is exposed to the MEMS device through the at least one orifice.

Still another embodiment is a method of manufacturing a MEMS display device. This method includes providing a package formed by a transparent substrate having a microelectromechanical system device formed thereon and a backplate sealed to the transparent substrate with a sealant, wherein an orifice is provided in the package; injecting a desiccant into the package through the orifice; and sealing the orifice. Another embodiment is a display device made by this method.

Yet another embodiment is a method of manufacturing a microelectromechanical systems (MEMS) based display device. This method includes providing a package formed by a transparent substrate having a microelectromechanical system device formed thereon and a backplate sealed to the transparent substrate with a sealant, wherein an orifice is provided in the backplate; and sealing the orifice with a plug, wherein the plug comprises a desiccant.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of the invention relate to the packaging of MEMS devices, such as interferometric modulators by low cost, high-throughput processes. In one embodiment, the MEMS devices are packaged in a process that closely mimics the manufacture of liquid crystal displays (LCDs). Large-scale manufacturing of LCDs has been undertaken by many companies throughout the world. Thus, adapting the packaging of MEMS devices to a process that closely parallels the LCD process allows these MEMS devices to be packaged in an efficient an high-throughput manner.

Figure 1:
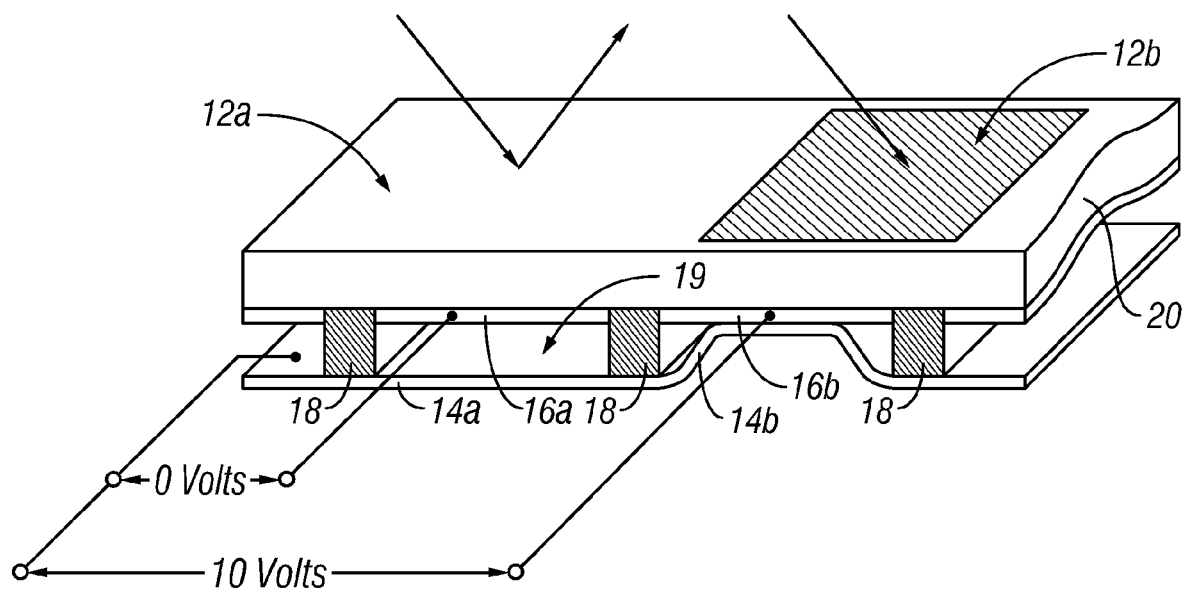
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
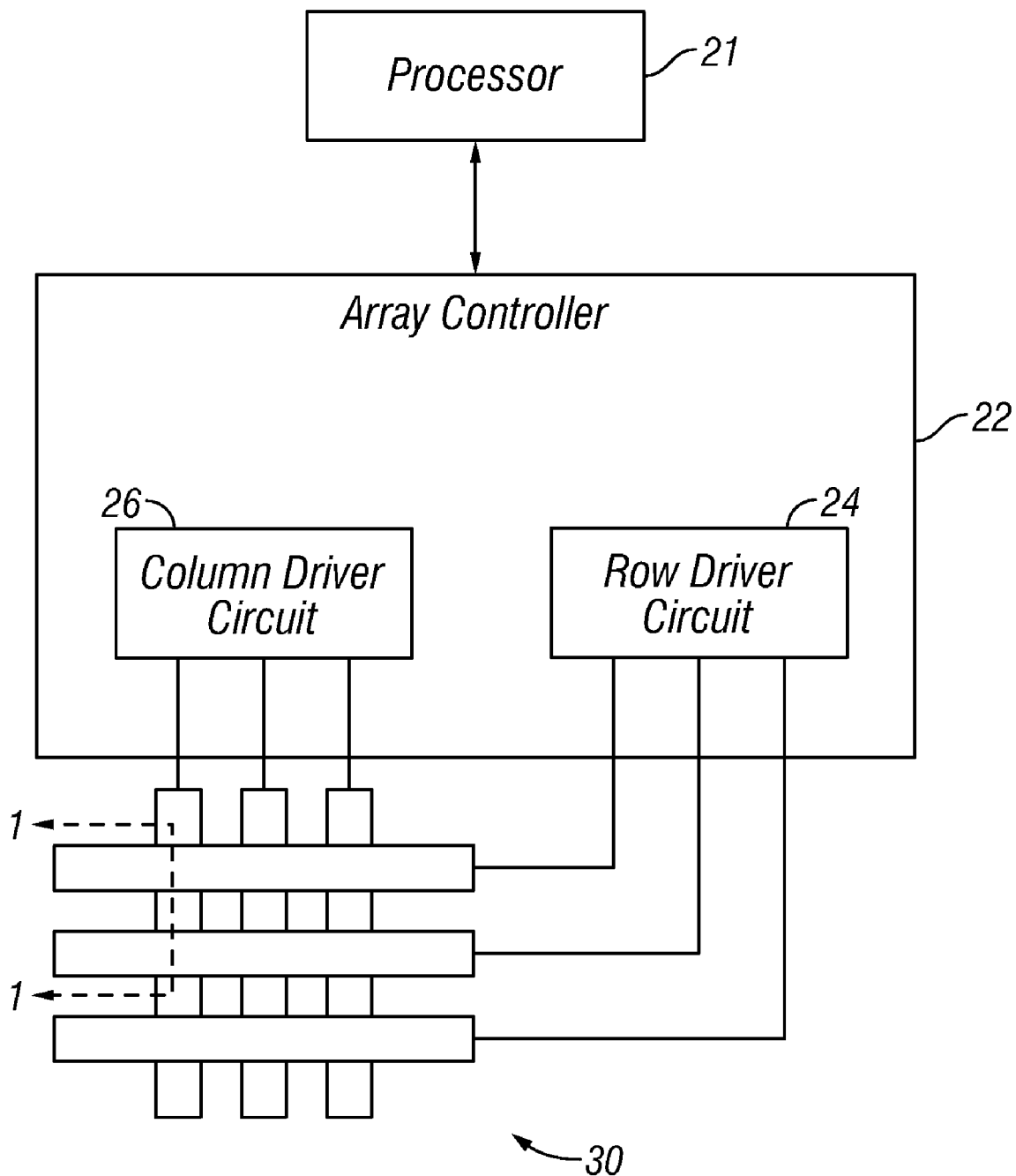
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
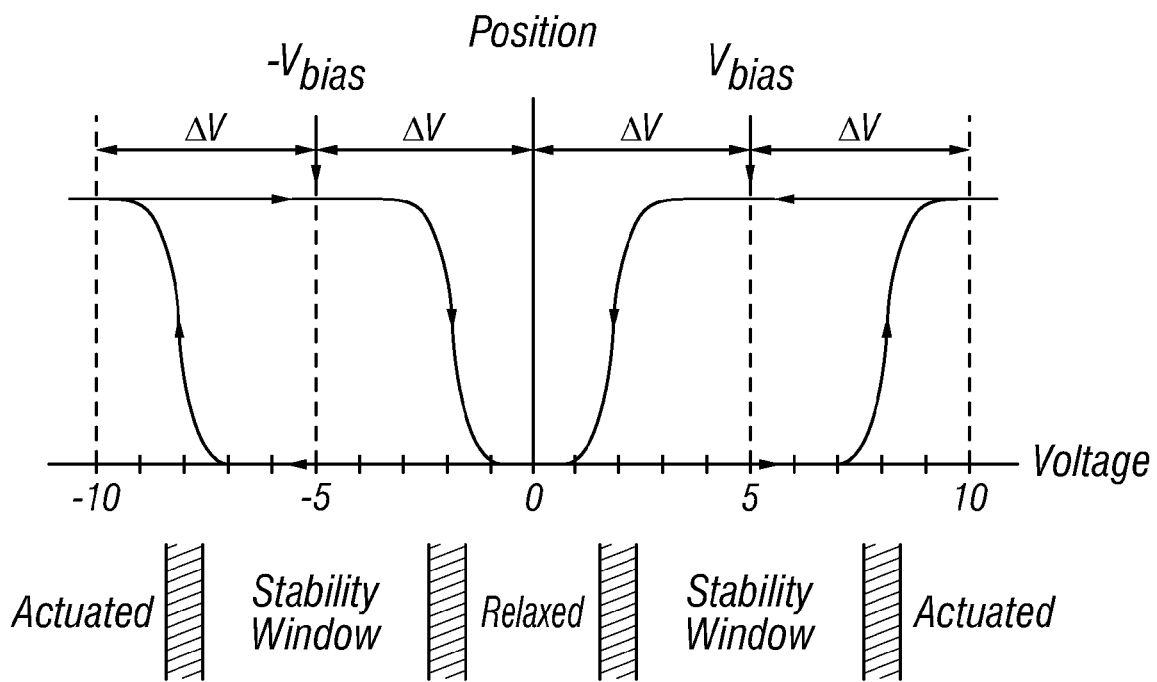
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
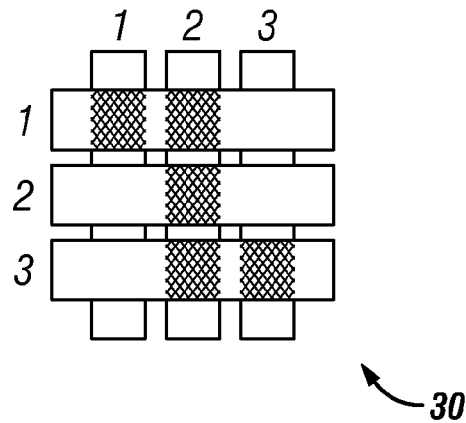
FIG. 5A illustrates one exemplary frame of display data in the 3×3 interferometric modulator display of FIG. 2.
Figure 5B:
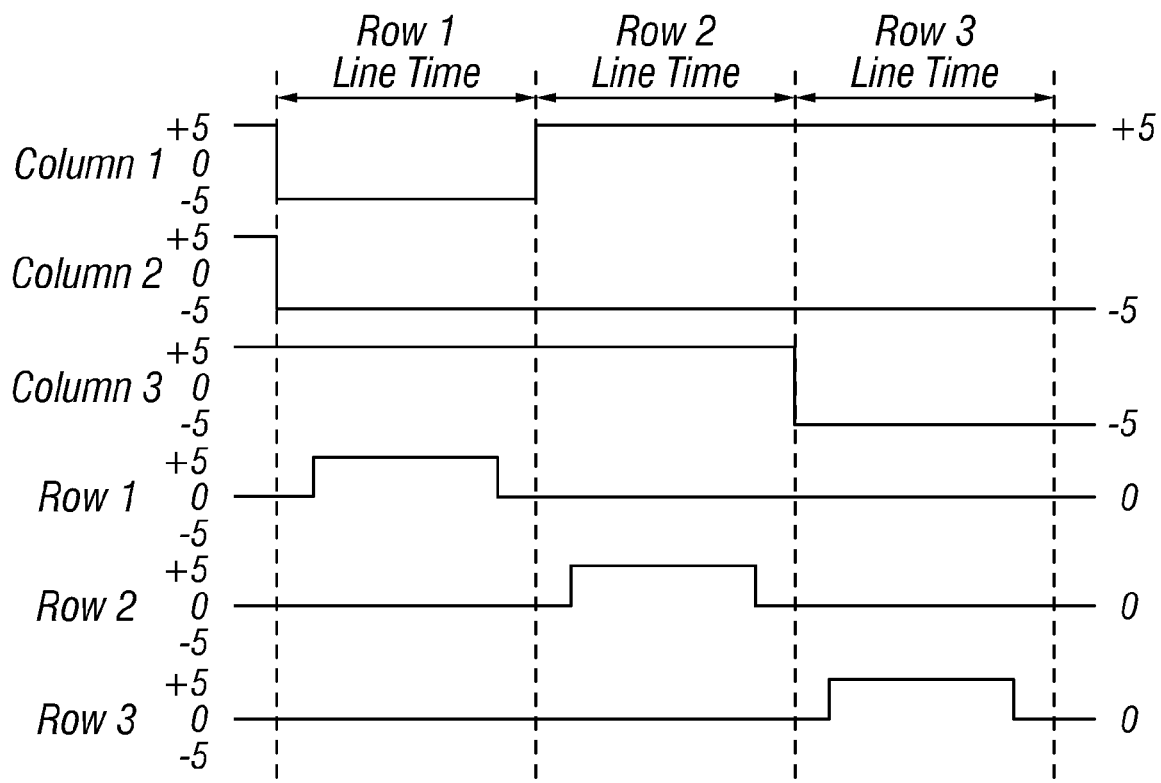
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to −$V_{bias}$, and the appropriate row to the same −ΔV, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
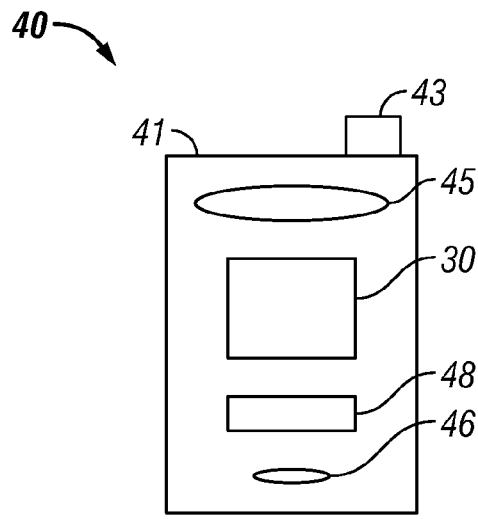
FIGS. 6A and 6B are system block diagrams illustrating an embodiment of a visual display device comprising a plurality of interferometric modulators.
Figure 6B:
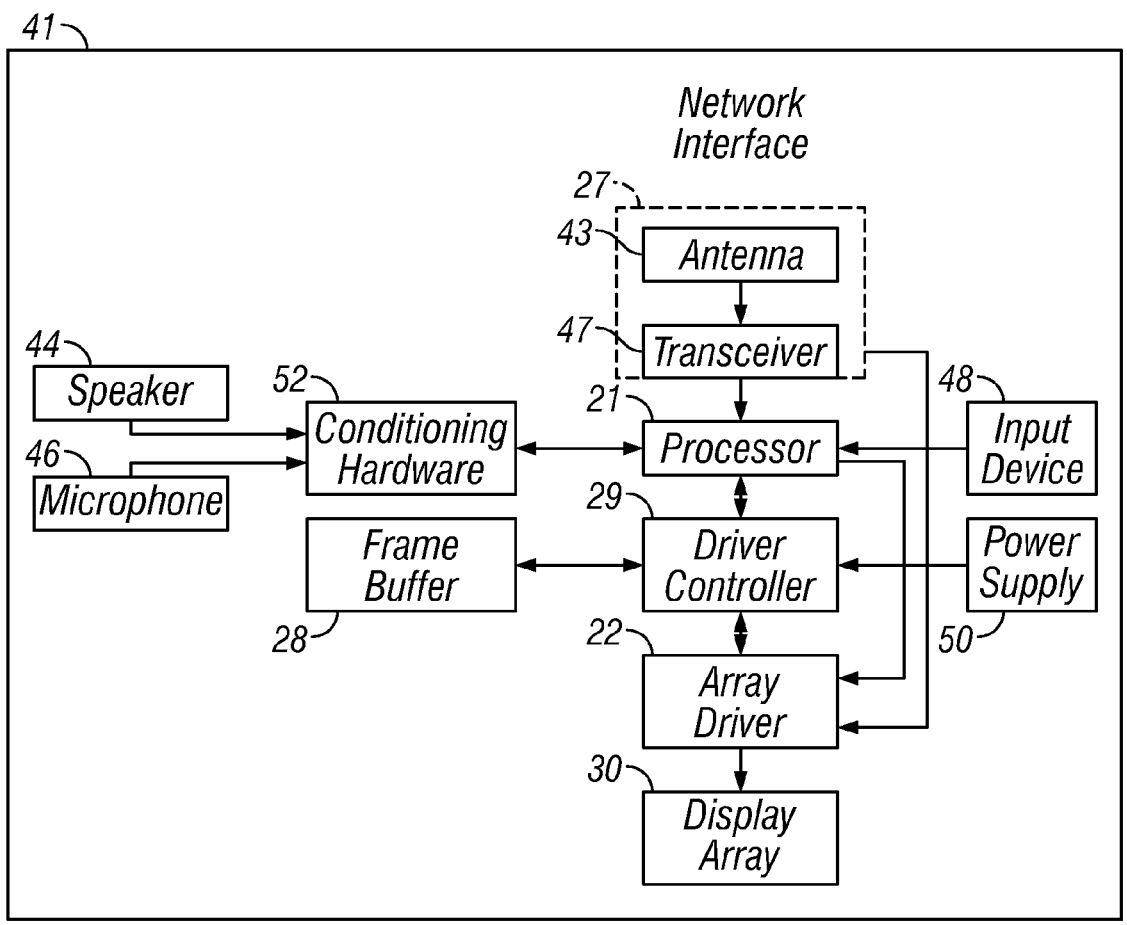

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
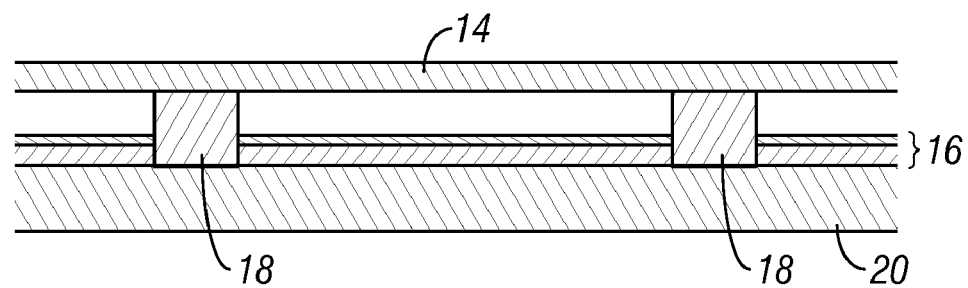
FIG. 7A is a cross section of the device of FIG. 1.
Figure 7B:
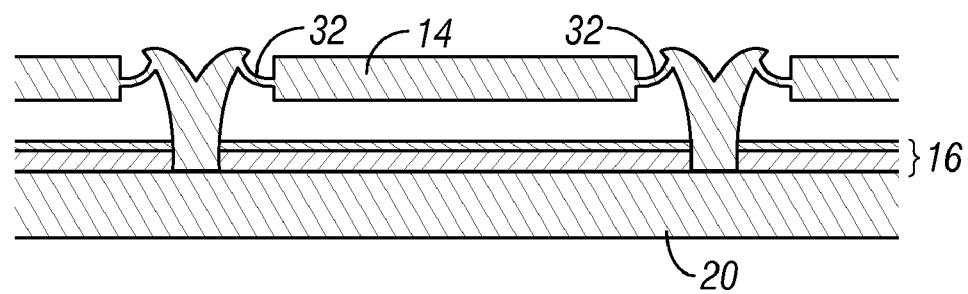
FIG. 7B is a cross section of an alternative embodiment of an interferometric modulator.
Figure 7C:
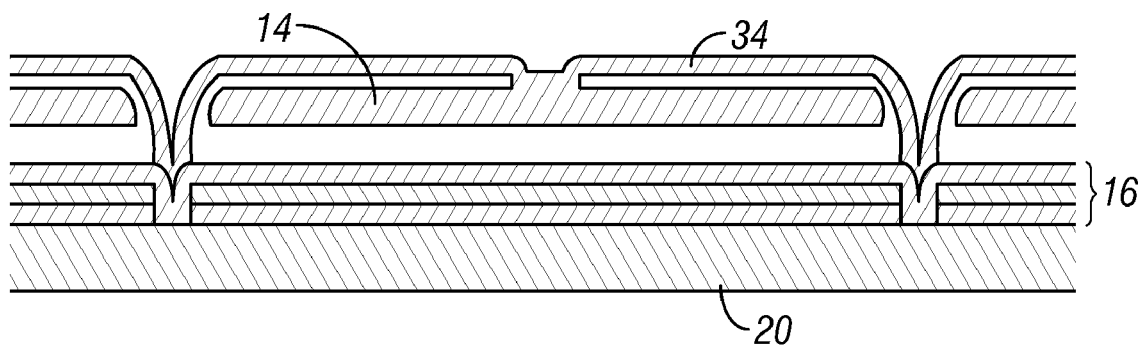
FIG. 7C is a cross section of another alternative embodiment of an interferometric modulator.
Figure 7D:
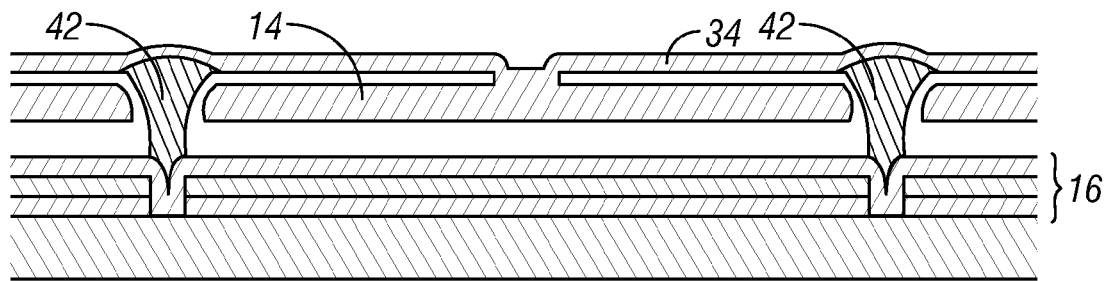
FIG. 7D is a cross section of yet another alternative embodiment of an interferometric modulator.
Figure 7E:
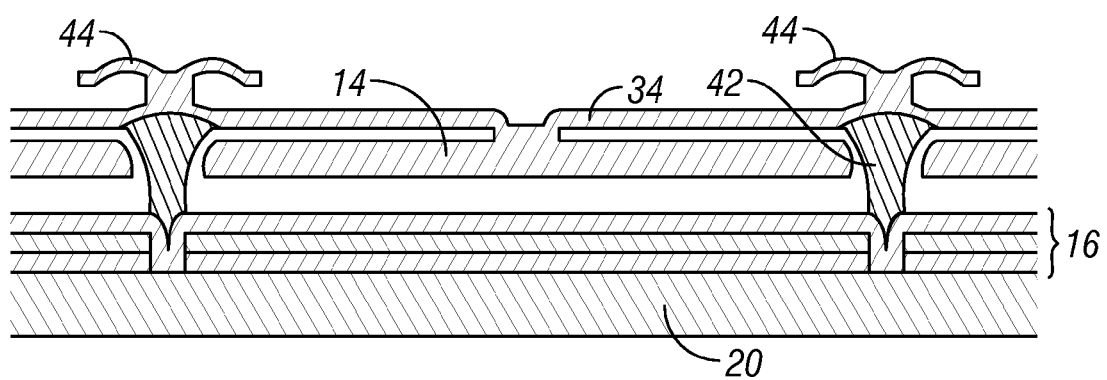
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
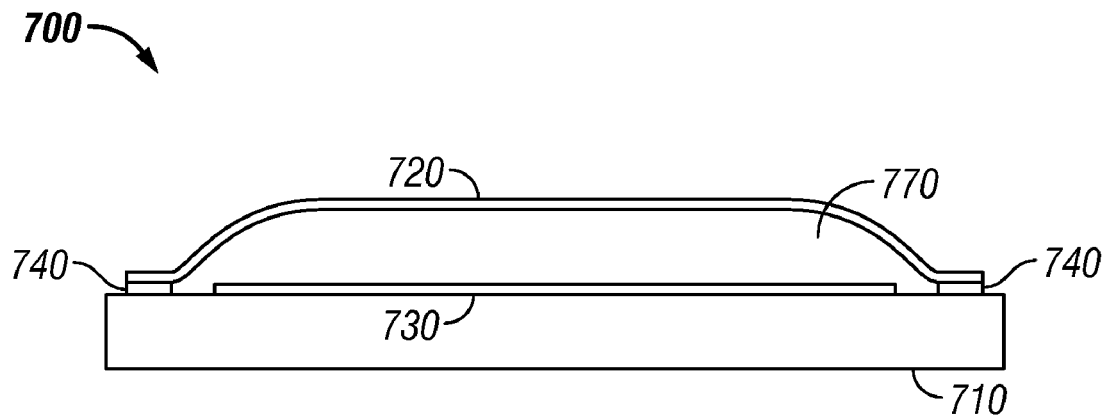
FIG. 8 is a cross-section of a basic package structure.

Packaging techniques for interferometric modulators will be described in more detail below. Interferometric modulators typically include moving parts, such as the movable mirrors 14a, 14b that must have a protected space in which to move. A schematic of a basic package structure 700 for an interferometric modulator is illustrated in FIG. 8. As shown in FIG. 8, a basic package structure 700 includes a transparent substrate 710 and a backplate cover or "cap" 720. As illustrated in FIG. 8, an interferometric modulator array 730 is encapsulated within the package structure 700. The backplate 720 and transparent substrate 710 may be sealed together to protect the interferometric modulator array 730 from harmful elements in the environment.

A method of packaging an interferometric modulator according to the embodiment shown in FIG. 8 will be discussed in more detail below. The packages and packaging methods described herein may be used for packaging any interferometric modulator, including, but not limited to, the interferometric modulators described above.

As discussed above, the interferometric modulator array 730 is configured to reflect light through the transparent substrate and includes moving parts, such as the movable mirrors 14a, 14b of FIG. 1. Therefore, to prevent these parts from being damaged, a gap or cavity 770 may be created between such moving parts and the backplate 720. It will be understood that, in an embodiment, the gap or cavity 770 is created when a backplate 720 having a recessed area is joined to the transparent substrate 710, as shown in FIG. 8.

The transparent substrate 710 may be any transparent substance capable of having thin film, MEMS devices built upon it. Such transparent substances include, but are not limited to, glass, plastic, and transparent polymers. Images are viewed through the transparent substrate 710, which serves as an imaging surface.

In accordance with an embodiment, an interferometric modulator array 730 may be formed on a transparent substrate 710. It will be understood that the fixed mirrors 16a, 16b (of FIG. 1) of the interferometric modulator array 730 are adjacent the transparent substrate 710 and the movable mirrors 14a, 14b are formed over the fixed mirrors 16a, 16b such that the movable mirrors 14a, 14b may move inside the package structure 700 of the embodiment shown in FIG. 8.

To form the interferometric modulator array 730, the transparent substrate 710, in one embodiment, is covered with indium tin oxide (ITO). The ITO may be deposited by standard deposition techniques, including chemical vapor deposition (CVD) and sputtering, for example, to a thickness of about 500 Å. A relatively thin layer of chrome may be deposited over the ITO. The ITO/chrome bilayer is then etched and patterned into columns to form the column electrodes 16a, 16b. A layer of silicon dioxide ($SiO_2$) may be formed over the ITO/chrome columns to create partially reflective fixed mirrors 16a, 16b. A sacrificial layer of, for example, silicon (Si) is deposited (and later released) over the structure to create a resonant optical cavity between the fixed mirrors 16a, 16b and the movable mirrors 14a, 14b. In other embodiments, this sacrificial layer may be formed of molybdenum (Mo), tungsten (W), or titanium (Ti).

Another mirror layer, formed of aluminum, may be deposited over the sacrificial layer of silicon to form the movable mirrors 14a, 14b of the interferometric modulator array 730. This mirror layer is deposited and patterned into rows orthogonal to the column electrodes 16a, 16b to create the row/column array described above. In other embodiments, this mirror layer may comprise reflective metals, such as, for example, silver (Ag) or gold (Au). Alternatively, this mirror layer may be a stack of metals configured to give the proper optical and mechanical properties.

The sacrificial layer is removed, for example, using a gas etching process, after the movable mirrors 14a, 14b are formed to create the optical cavity between the fixed mirrors 16a, 16b and the movable mirrors 14a, 14b. In an embodiment, this sacrificial layer is removed after the backplate is joined to the transparent substrate through an opening in either the backplate or perimeter seal, as will be described in more detail below. Standard etching techniques may be used to remove the sacrificial layer of silicon. The particular release etching will depend on the material to be released. For example, xenon difluoride ($XeF_2$) may be used to remove the silicon sacrificial layer. In another embodiment, the sacrificial layer of silicon between the mirrors 16a, 16b, 14a, 14b is removed before the backplate 720 is joined to the transparent substrate 710. The skilled artisan will appreciate that each layer of the interferometric modulator array 730 may be deposited and patterned using standard deposition techniques and standard photolithographic techniques.

The skilled artisan will understand that the backplate 720 serves a mechanical function, protecting the interferometric modulator array 730 from contaminants in the environment. The backplate 720 along with the transparent substrate 710 and a seal 740 (which is described in more detail below) prevent mechanical interference, moisture, and contaminant gases from reaching and potentially damaging the interferometric modulator array 730 within the package 700. The backplate 720 may therefore be formed of any suitable material, whether transparent or opaque, conductive or insulating. Suitable materials for the backplate 720 include, but are not limited to, glass (e.g., float, 1737, soda lime), plastic, ceramics, polymers, laminates, and metals and metal foils (e.g., stainless steel (SS302, SS410), Kovar, plated Kovar).

A sealing means or a seal 740 is typically provided to join the transparent substrate 710 and the backplate 720 to form the package structure 700. The seal 740 may be a semi-hermetic seal, such as a conventional epoxy-based adhesive. In other embodiments, the seal 740 may be Polyisobutylene (PIB), o-rings, polyurethane, thin film metal weld, liquid spin-on glass, solders, polymers, or plastics, among other types of seals. In still other embodiment, the seal 740 may be a hermetic seal.

In some embodiments, once the backplate 720 and transparent substrate 710 are joined, the seal 740 may be cured and hardened. The skilled artisan will appreciate that the seal 740, which may be hardened, between the backplate 720 and the transparent substrate 710 is different from seals that may be applied after division of the package structure 700 into individual arrays.

It may be desirable to manufacture several arrays of interferometric modulators on a single transparent substrate, apply the backplate, and then divide the structure into individual arrays. Once the seal 740 is hardened, the structure may be mechanically or laser scribed or otherwise prepared for division. Depending on the seal 740, as well as other factors, it may be advantageous, after the division, to apply an endseal to the individual package structures or arrays.

Figure 9A:
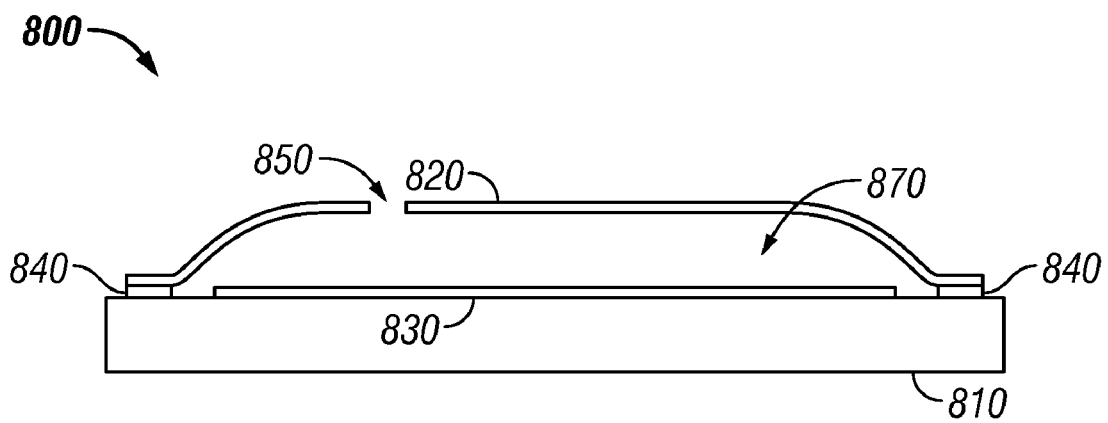
FIG. 9A is a cross-section of a package structure in accordance with an embodiment having an opening in the backplate.
Figure 9B:
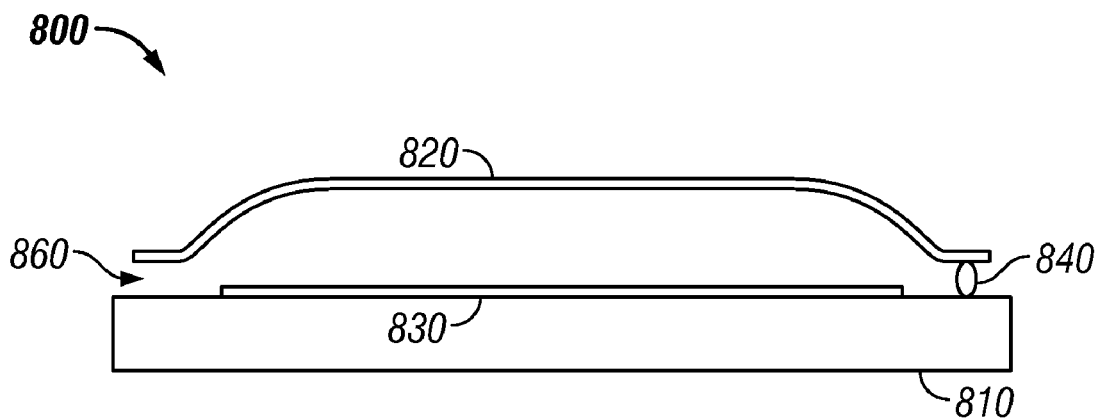
FIG. 9B is a cross-section of a package structure in accordance with an embodiment having an opening in the perimeter seal.
Figure 9C:
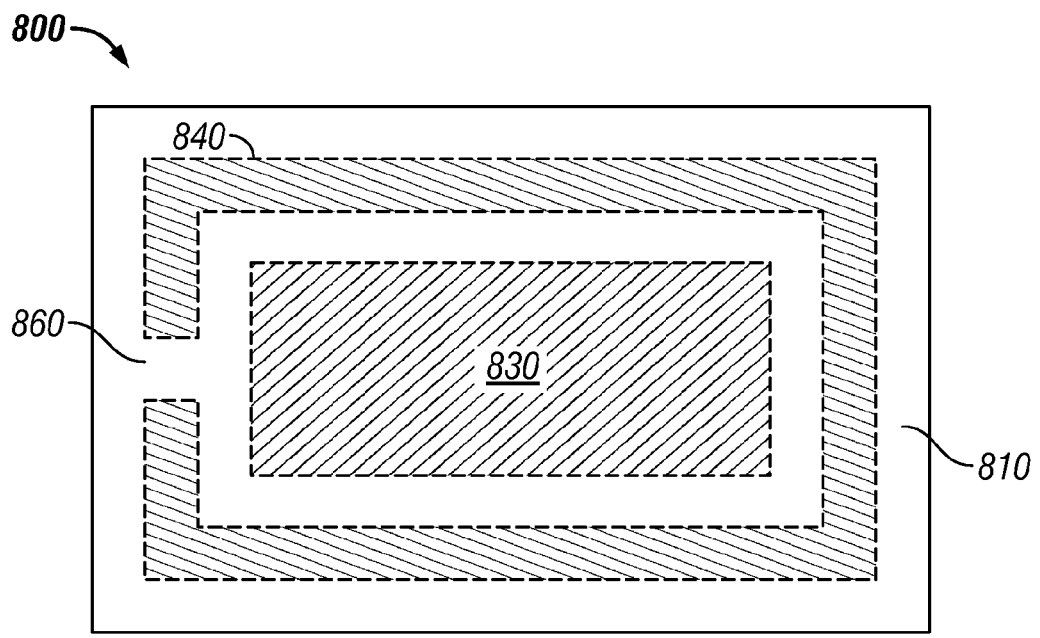
FIG. 9C is a top plan view of a package structure shown in FIG. 9B.
Figure 9D:
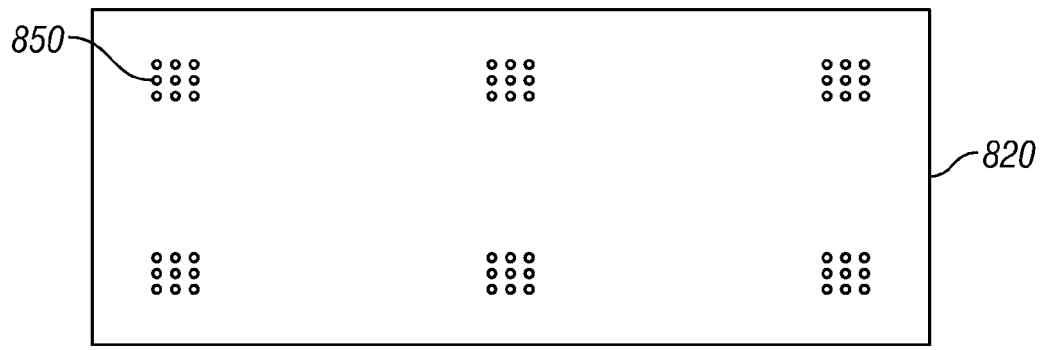
FIG. 9D is a top plan view of a backplate having openings according to an embodiment.
Figure 9E:
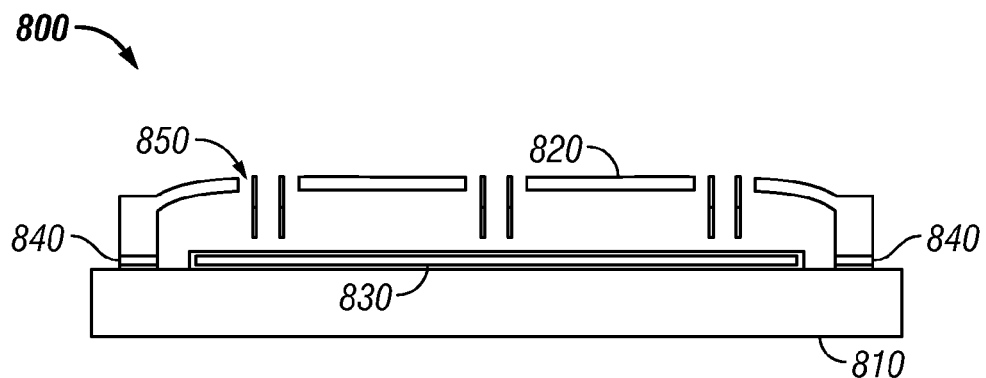
FIG. 9E is a cross-sectional view of a package structure having openings in the backplate.
Figure 9F:
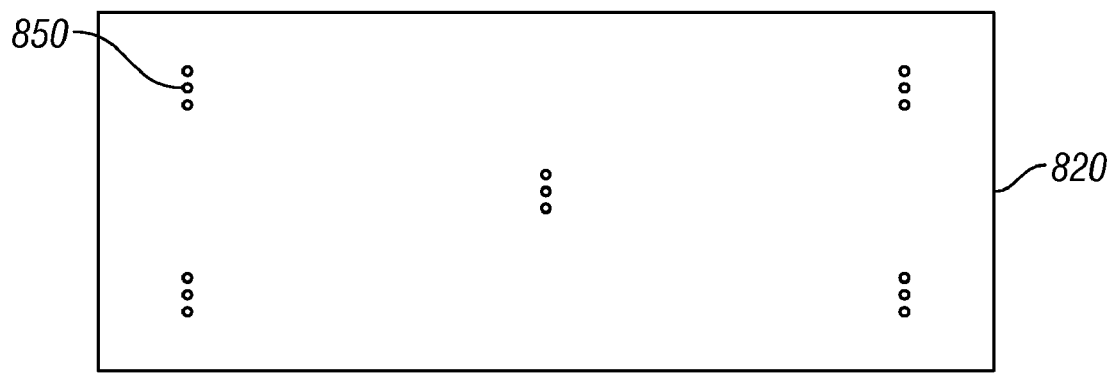
FIG. 9F is a top plan view of a backplate having openings according to another embodiment.
Figure 9G:
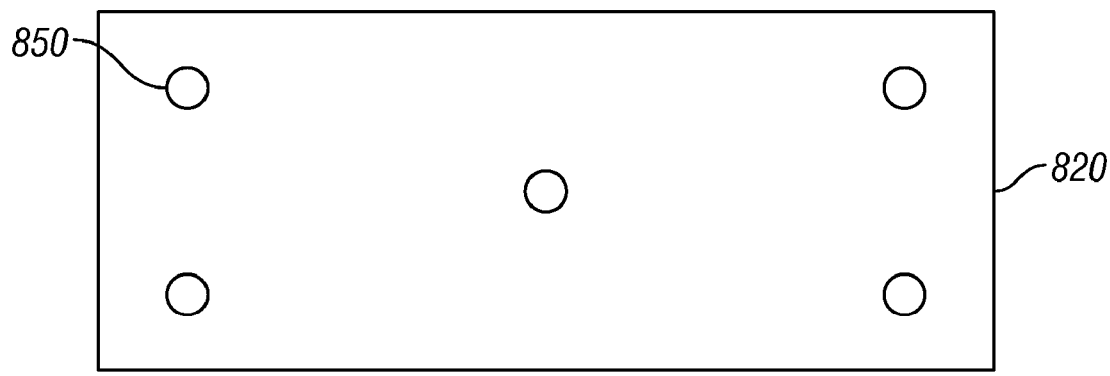
FIG. 9G is a top plan view of a backplate having openings according to yet another embodiment.

A side-view illustration of an embodiment of a package structure 800 having an endseal opening is shown in FIG. 9A. An endseal opening is typically either an opening in an otherwise continuous perimeter seal (as shown in FIG. 9B) or an opening or hole 850 in the backplate 820, as shown in FIG. 9A. FIG. 9C is a top plan view of the embodiment shown in FIG. 9B. As shown in FIGS. 9B and 9C, the perimeter seal is not continuously dispensed, leaving an opening 860 in the seal 840.

The use of openings or holes 850 in the packaging process allows packaging to take place in ambient conditions, where the atmospheric conditions are not controlled for the benefit of the manufacturing process. Generally ambient conditions may be the laboratory conditions in a substantially particle-free clean room typically having a temperature around 70° F. and relative humidity in the range of about 40 to about 60%, or about 50%. The openings or holes 850 allow pressure within the package 800 to escape so that the pressure does not cause the transparent substrate 810 and the backplate 820 to come apart during the joining or sealing process because pressure does not build up within the package 800. Allowing the pressure within the package to escape via the openings 850 provides for constant pressure within the package 850, which also allows a more uniform seal width even if the seal is not dispensed with a uniform thickness.

The opening or hole 850 may also be configured to allow material to enter and exit the package 800. In particular, the opening or hole 850 may be configured to allow for application of a solvent to the interferometric modulator array 830 for removal of a spacer or sacrificial layer, which will be described in more detail below. The skilled artisan will understand that an endseal may not be necessary, as will be described in more detail below.

Generally, it is desirable to minimize the permeation of water vapor into the package structure 800 and thus control the environment inside the package structure 800. The package structure 800 may be hermetically sealed to ensure the environment within the package structure 800 remains constant regardless of the surrounding environment. An example of a hermetic sealing process is disclosed in U.S. Pat. No. 6,589,625, the entirety of which is hereby incorporated by reference.

In one embodiment having a hermetic seal, the seal 840 is a hermetic barrier that acts as an environmental barrier preventing all air and water vapor from flowing through the seal 840 and entering the package structure 800. Suitable materials for a hermetic seal include, but are not limited to, welds, solders, adhesives mixed with molecular sieves, such as a zeolite. The adhesive component alone cannot act as a suitable environmental barrier because it will eventually allow moisture and other contaminants to permeate into the package structure 800. A semi-hermetic seal 840 of one of the aforementioned materials is desirable for space-critical environments because the seal 840 can be very thin and inexpensive, relative to other sealing techniques, such as welding and soldering. The semi-hermetic seal 840 may be applied through simple in-line manufacturing processes, whereas the techniques of welding and soldering for hermetic seals require very high temperature processes that can damage the package structure 800, are relatively expensive, and tend to occupy much more space because a welded or soldered seal is thicker. It will be understood that a semi-hermetic seal may include an adhesive that is not mixed with any molecular sieves or desiccants.

In one embodiment, the zeolites may include aluminosilicate-structured minerals, such as sodium aluminosilicate. In another embodiment, the zeolites may include microporous silicate-structured minerals. It will be appreciated that active components, other than zeolites, that can act as absorbing filters on the molecular level can also be used. In one embodiment, the adhesives may be a low outgassing adhesive. In other embodiments, the adhesives may be adhesives with varied outgassing. A desiccant used in the seal may be a calcium dioxide, strontium oxide (SRO), silica gels, montmorillonite clay (such as a magnesium aluminum silicate), molecular sieves (zeolites), or calcium sulfates.

The skilled artisan will understand that the amount of material for the seal 840 will depend on the estimated amount of moisture or contaminant gases that will need to be removed from within the package structure 800 during the lifetime of the package structure 800. The amount of material for the seal 840 also depends not only on the amount of moisture or contaminant gases inside the package structure 800 when the package is formed, but also the permeation rate of the seal 800 and the outgassing potential of the package components.

Zeolites may absorb water molecules at relatively high temperatures. Zeolites can trap moisture and contaminant gases in their pores. The skilled artisan will understand that zeolites having deferent pore sizes can be selected for the seal 840 material to absorb different contaminants. In an embodiment, zeolites are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of about fifty angstroms (50 Å) can be used to absorb nitrogen and carbon dioxide molecules. The skilled artisan will appreciate that the hermetic seal 840 may be comprised of a mixture of zeolites having various pore sizes.

The seal 840 is typically applied to the transparent substrate 810 along the perimeter, around the interferometric modulator array 830. The skilled artisan will understand that, in an embodiment in which the package structure 800 contains more than one interferometric modulator array 830, the seal 840 is typically applied to the transparent substrate 810 around the perimeter of the of interferometric modulator array 830. In certain embodiments, the seal 840 may be formed to a thickness in a range of about 1 to about 20 microns, or in a range of about 12 to about 18 microns, or about 15 microns. The skilled artisan will appreciate that the thickness of the seal 840 will depend on various factors, including the estimated lifetime of the device, the material of the seal 840, the amount of contaminants and moisture that are estimated to permeate into the package structure 800 during the lifetime, the humidity of the ambient environment, and whether a desiccant is included within the package structure 800 and the flatness of the backplate 820 and the transparent substrate 810. The backplate 820 is then positioned over the transparent substrate 810, and the transparent substrate 810 and the backplate 820 are sealed together by the seal 840 to form the package structure 800.

In some embodiments, an outer bead (not shown) of adhesive is applied around the perimeter of the seal 840. The outer bead may include a low permeation rate adhesive, which can provide additional environmental protection to the package structure 800. The outer bead of adhesive may be useful in an environment having a great deal of contaminants where the seal 840 alone cannot serve as an effective hermetic seal without being loaded with an impractical amount of the active component. For example, if the seal 840 includes a high portion of zeolites (e.g., more than 60 percent zeolites by weight), the seal 840 can become microscopically porous as well as highly viscous and thus difficult to apply. Such a seal 840 having a high portion of zeolites may not provide a robust mechanical support to the package structure 800. The outer bead may also provide additional mechanical support.

As shown in FIG. 9A, the backplate 820 may be formed with at least one opening 850 therein. A release material, such as xenon difluoride ($XeF_2$), may be introduced through the opening into the interior of the package structure 800 to remove the sacrificial layer within the interferometric modulator array 830 (between the fixed mirrors 16a, 16b and the movable mirrors 14a, 14b). The number and size of these openings 850 may depend on the desired rate of removal of the sacrificial layer.

To remove a sacrificial layer of molybdenum (Mo), silicon (Si), tungsten (W), or titanium (Ti), xenon difluoride ($XeF_2$) may be introduced into the interior of the package structure 800 through an opening or openings 850 in the backplate 820. Such openings 850 in the backplate 820 may be created by etching an opening in the backplate 820. The xenon difluoride ($XeF_2$) reacts with the sacrificial layer to remove it. A sacrificial layer formed of spin-on glass or oxide may be gas etched or vapor phase etched to remove the sacrificial layer after the backplate 820 has been joined to the transparent substrate 810. The skilled artisan will appreciate that the removal process will depend on the material of the sacrificial layer.

After the sacrificial layer is removed, the opening(s) 850 in the backplate 820 may be sealed. In an embodiment, a thermally or UV cured polymer is used to seal these openings. The opening(s) may also be sealed with metal or glass caps, metal foil, adhesive, welds, or solder. The skilled artisan will appreciate that other materials may be used as well and that materials having high viscosity are advantageous.

As shown in FIGS. 9B and 9C, the package structure 800 may have an opening 860 in the perimeter seal 840 rather than, or in addition to, an opening in the backplate 820. The opening 860 in the seal 840 provides the same advantages as those described above for an opening in the backplate 820, including allowing for packaging at ambient conditions, and introduction of a release material, desiccant, and self-aligning monolayer. As with the opening in the backplate, in this embodiment, the opening 860 in the seal 840 may be closed to form a sealed opening after the joining of the transparent substrate 810 and the backplate 820 and introduction of desiccant, release material, and self-aligning monolayer, if desired. In one embodiment, the opening 860 is sealed with a polymer, such as UV or thermally cured. It is advantageous that the polymer has a lower viscosity than that of the perimeter seal 840 such that increase surface tension helps the polymer to fully seal the opening 860.

It will be understood that there may be more than one opening 850 in the backplate, as shown in FIGS. 9D-9G. In the embodiment shown in FIG. 9A, the opening or hole 850 may be closed to form an endseal or sealed opening to complete the package 800 with, for example, a metal or glass cap, metal foil, adhesive, solder, or UV or thermally cured polymer.

It is appreciated that there are other uses for metal caps. For example, metal caps may be used with a backplate formed of a printed circuit board (PCB) backplate that may include electronic interfaces for use with radio-frequency (RF) signals. A PCB backplate may serve not only as protection for circuitry that is integrated into the backplate but may also enhance RF circuit needs. For example, metal caps may be included for RF enhancement or protection. Antenna properties may also be incorporated into the PCB backplate or the interferometric modulator, including, but not limited to, the use of a metal backplate or a metal cap as an antenna for a cellular phone.

In another embodiment, following removal of the sacrificial layer and prior to sealing the opening(s) 850, a desiccant can be applied inside the package structure 800 in a vapor form through, for example, the opening(s) 850. In certain embodiments, a portion of a desiccant 860 could be included or applied to the interior surface of the backplate 820, as shown in FIG. 9. In addition, more or other types of desiccants can be applied to the interior of the package 800 through the opening(s) 850. The size of the opening(s) 850 may be small and can thereby allow both high-absorption rate desiccant or slow-absorption rate desiccant to be incorporated into the backplate 820 prior to joining of the backplate 820 to the transparent substrate 810 because the amount of air that will pass into the package 800 through the opening(s) without any vacuum or pressure driving force is sufficiently small. In one embodiment, the opening 850 has a diameter in a range of about 10 to about 100 microns. The opening(s) 850 allow for a desiccant 860 to be incorporated into the backplate 820 prior to assembly and for some gas or etchant to be injected through the opening(s) 850 to either activate the desiccant 860 or to deposit additional desiccant in the package 800.

As noted above, a desiccant may be used to control moisture resident within the package structure 800. However, if the seal 840 is fully hermetic, a desiccant may not be necessary to prevent moisture from traveling from the atmosphere into the interior of the package structure 800.

The elimination of the need for a desiccant also allows the package structure 800 to be thinner, which is desirable. However, in certain embodiments, such as those having a semi-hermetic seal, a desiccant may be advantageous. Typically, in packages containing desiccants, the lifetime expectation of the device may depend on the lifetime of the desiccant. When the desiccant is fully consumed, the interferometric modulator display may fail as sufficient moisture enters the package structure to cause damage to the interferometric modulator. The theoretical maximum lifetime of the device is determined by the water vapor flux into the package as well as the amount and type of desiccant.

It is understood that in an embodiment of the package structure having a hermetic seal, the lifetime of the device is not dependent on the desiccant capacity, or the geometry of the seal. In such a package structure, the interferometric modulator will not fail due to a consumed desiccant.

As mentioned above, a desiccant may be used to reduce moisture resident within the package structure 800. Desiccants may be used for packages that have either hermetic or semi-hermetic seals. In a package having a semi-hermetic seal, a desiccant may be used to control moisture moving into the package from the environment. The skilled artisan will appreciate that a desiccant may not be necessary for a hermetically sealed package, but may be desirable to control moisture within the package structure 800. For packages having hermetic seals, desiccants may be provided within the package to absorb any moisture that moves into the package during the manufacturing process.

Generally, any substance that can trap moisture while not interfering with the optical properties of the interferometric modulator array 830 may be used as the desiccant. Suitable desiccant materials include, but are not limited to, zeolites, molecular sieves, surface adsorbents, bulk adsorbents, and chemical reactants. The skilled artisan will appreciate that the desiccant material should be selected based on a variety of factors, including the estimated amount to contaminant gases in the environment as well as the absorption rate and amount of the desiccant material.

The desiccant may be in different forms, shapes, and sizes. In addition to being in solid form, the desiccant may alternatively be in powder form. These powders may be inserted directly into the package or they may be mixed with an adhesive for application. In an alternative embodiment, the desiccant may be formed into different shapes, such as cylinders or sheets, before being applied inside the package.

Figure 10:
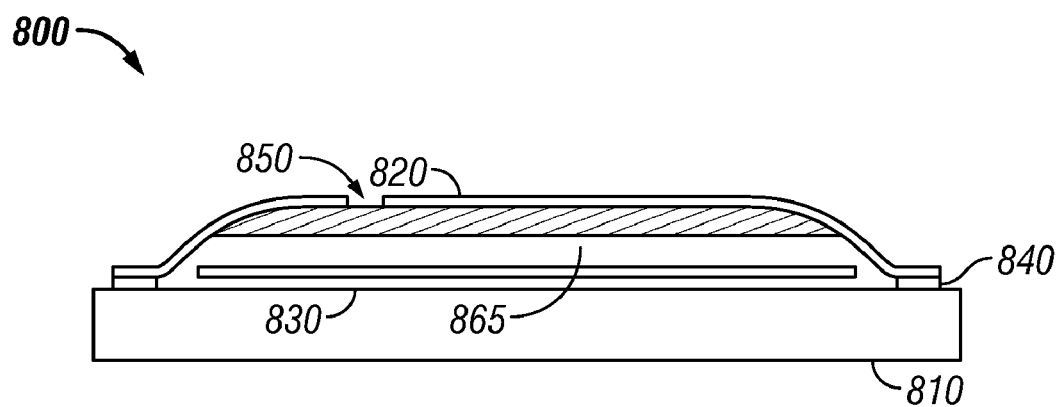
FIG. 10 is a cross-section of a package structure in accordance with an embodiment having an opening in the backplate and desiccant within the package.

In another embodiment, the desiccant may be applied after the transparent substrate 810 and the backplate 820 are joined. According to this embodiment, as shown in FIG. 10, a small hole or opening 850 is formed in the backplate 820. The skilled artisan will appreciate that more than one hole or opening 850 may be formed in the backplate 820. In the embodiment shown in FIG. 10, the opening or hole 850 may be formed prior to joining the backplate 820 to the transparent substrate 810. The opening or hole 850 allows desiccant 865 to be injected into individual package structures 800 after the backplate 820 and transparent substrate 810 have been sealed together. In this embodiment, sealing the opening or hole 850 is also required to form the sealed package structure 800 such that the interior of the package structure 800 is isolated from the surrounding ambient environment. The skilled artisan will appreciate that the opening or hole 850 can also facilitate a complete perimeter seal process, thereby eliminating the typical LCD-type endseal opening used in the perimeter seal 840. The opening or hole 850 in the backplate 820 may be sealed after injection of a desiccant into the package 800.

Those skilled in the art will also appreciate that, in certain embodiments, a self-aligning monolayer, or anti-stiction coating, is applied within the package 800 to allow the moving parts (e.g., elements 14a, 14b) of the interferometric modulator array 830 to move easily. The self-aligning monolayer can be applied to the interior of the package structure 800 through the opening(s) 850. The monolayer may comprise a material configured to reduce the surface friction on the moving parts and/or repel water vapor from the moving parts. Exemplary materials for the self-aligning monolayer include, but are not limited to, fluoro silane, chloro-fluoro silane, methoxy silane, trichlorosilane, perfluorodecanoic carboxylic acid, octadecyltrichlorosilane (OTS), dichlorodimethylsilane, or hydrophobic or non-stick materials, such as PTFE, teflon, silicone, polystyrene, polyurethane (both standard and ultraviolet curable), a block copolymer containing a hydrophobic component (for example poly-methyl-methacrylate), or polysilazane (especially with polisiloxane). In some embodiments, an exemplary materials for a self-aligning monolayer include, but are not limited to, inorganic materials such as one or more of the following: graphite, diamond-like carbon (DLC), silicon carbide (SiC), a hydrogenated diamond coating, or fluorinated DLC. The presence of water vapor between the moving parts may increase the force needed to separate the moving parts, and is disadvantageous. Thus, reduction of the surface friction and/or the ability of water vapor to collect on the moving parts accordingly reduces the force necessary to separate the moving parts. However, it should be understood that typical ambient humidity levels do not provide sufficient water vapor to adversely affect the functioning of the interferometric modulator array 830 within the package 800.

Generally, interferometric modulators have a higher tolerance (e.g., up to about 10%) for humidity requirements that organic light emitting diodes (OLED) displays. It is possible that water vapor permeates into the package 800 even if it is semi-hermetically or hermetically sealed. In certain embodiments in which a desiccant is placed in the interior of the package 800, a certain amount of moisture permeation may be tolerated, depending on the capacity of the desiccant. However, if there exists moisture or water vapor in an amount higher than the tolerance level, or if there is more water permeation into the package 800 than desired, the interferometric modulator array 830 is likely to have a shortened lifetime or may fail to operate properly. Also, in certain embodiments, moisture, which has been created and/or permeated during assembly, may not have been properly removed before completing the fabrication of the package. Furthermore, the relative humidity level in the interior of the package, particularly without a desiccant, should be maintained less than the tolerance level so that the interferometric modulator array 830 operates properly for the duration of its expected lifetime.

Figure 11A:
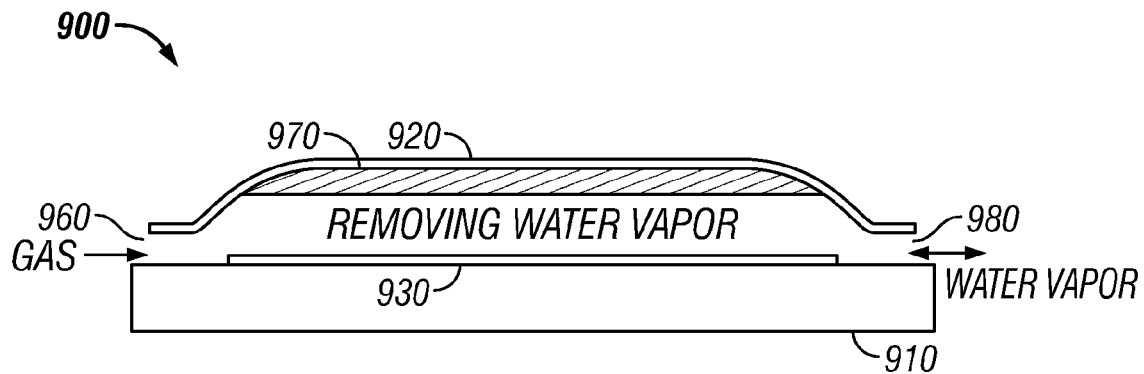
FIGS. 11A-11B are schematic views showing a process of removing water vapor from the package according to an embodiment.
Figure 11B:
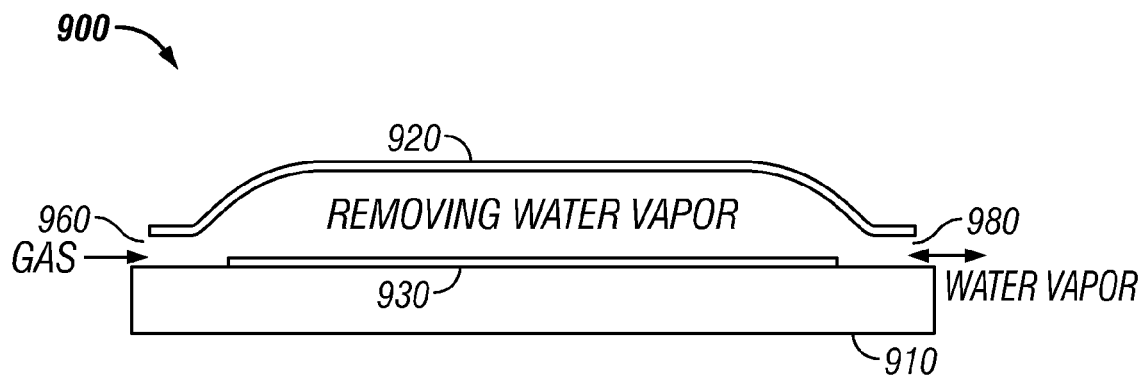
Figure 11C:
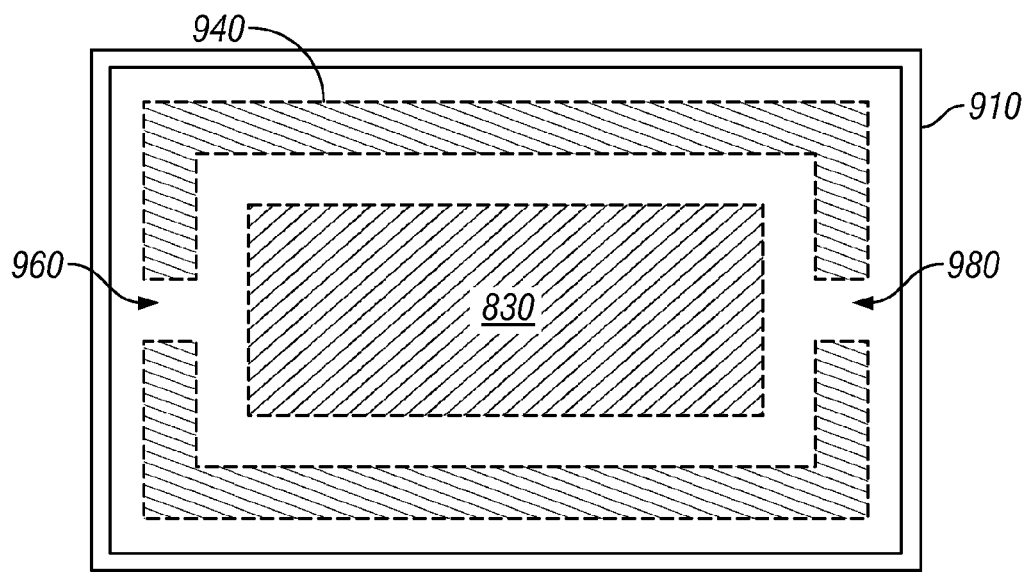
FIG. 11C is a top plan view of the embodiment shown in FIG. 11B.

FIGS. 11A-11B illustrate schematic diagrams showing a process of removing water vapor from the package according to an embodiment. The package 900 in FIG. 11A includes a desiccant 970, whereas the package 900 in FIG. 11B does not. FIG. 11C is a top plan view of the embodiment shown in FIG. 11B. As shown in FIG. 11C, the seal 940 is not dispensed continuously to create an inlet 960 and an outlet 980 in the seal 940. A water vapor removing process will be described in more detail below. As used herein, the term "water vapor" may include any kind of water, including, but not limited to, liquid water, gaseous water (in vapor phase), or condensed water on surfaces inside the package.

As shown in FIGS. 11A-11B, an inlet 960 and an outlet 980 are defined in the seal 940. In one embodiment, the inlet 960 is configured to supply a gas into the interior of the package 900 and the outlet 980 is configured to allow water vapor to exit the package 900. In the embodiments shown in FIGS. 11A-11B, one inlet and one outlet are defined in the seal 940.

In an alternative embodiment, one inlet and a plurality of outlets are defined in the seal. In an embodiment, at least one of the inlet 960 and outlet 980 is formed with the use of a scriber. In this embodiment, the shape of the inlet 960 and outlet 980 is substantially circular. In another embodiment, the inlet 960 and outlet 980 may have shapes other than circular. The skilled artisan will appreciate that the inlet 960 and/or outlet 980 may alternatively be formed by drilling or with the use of any other appropriate tool or process.

In certain embodiments, the inlet 960 and the outlet 980 have substantially the same size. In other embodiments, the inlet 960 and outlet 980 may be of different sizes. For example, the size of the inlet 960 can be greater than that of the outlet hole 980. Alternatively, the sizes of the inlet 960 and outlet 980 may be determined by the criteria of how effectively or easily they may be sealed after the water vapor is removed, as will be described in more detail below. In other words, so long as sealing can be effectively performed, the inlet 960 and outlet 980 can be of any size. The diameter of at least one of the inlet 960 and the outlet 980 may be in the range of about 10 microns to about 2 mm, or in the range of about 500 microns to about 1.5 mm, or about 1 mm.

The inlet 960 and outlet 980 may be defined in the seal 940 simultaneously. Alternatively, one of the inlet 960 and the outlet 980 is defined first and thereafter the other is defined in the seal 940. For example, the inlet 960 may be formed first, and the outlet 980 may be formed after gas has been introduced through the inlet 960 and into the package 900. In this embodiment, the gas pressure in the interior of the package 900 can be increased so as to enhance the water vapor removal process.

In an embodiment, the gas introduced into the package 900 is a dry inert gas, such as molecular nitrogen, $N_2$. In another embodiment, the gas is argon. It will be understood that the gas can be any type of gas that is effective in removing water vapor in the interior of the package 900 by, for example, pressure, drying, driving off (blowing), or vacuuming (sucking). The gas may be, for example, air, heated air, a heated gas, or a dry gas.

The gas may be continuously fed through the inlet 960 and into the interior of the package 900 until all of the water vapor is substantially removed. In an embodiment, whether the water vapor has been substantially removed can be determined by monitoring the humidity at the outlet port 980 to measure the humidity of the gas exiting the outlet 980.

In yet another embodiment, at least a portion of the water vapor can be removed from the interior of the package 900 through an opening in the package 900 with the use of, for example, a vacuum pump. The supplied gas can also remove other unwanted material (e.g., dust, other unwanted particles or liquid material) in addition to the water vapor. In this embodiment, the package 900 may be placed in a chamber (or vacuum chamber), and the gas may be fed into the package 900 by evacuating the chamber and then refilling it with a dry gas, such as nitrogen or argon. In this embodiment, at least a partial vacuum is created around the package 900 to draw out the water vapor from the interior of the package 900. It will be understood that, in this embodiment, only one opening in the package 900 is necessary. Thus, it is not necessary to have both an inlet 960 and an outlet 980 is this embodiment.

In one embodiment, water vapor may be removed during the fabrication process for the package 900. In this embodiment, a "release" or removal process can be used in which the sacrificial layer in the interferometric modulator array 930 is etched away first, as described above. Then, water vapor (and/or any unwanted or unnecessary material) in the interior of the package 900 can be removed with the use of a carrier gas (e.g., nitrogen or argon) introduced into the package through the inlet 960 formed in the seal 940. In an embodiment, the removal process is performed by a MEMS etching system, such as, for example, X3 Series Xetch, which is available from XACIX, USA, and MEMS ETCHER, which is available from Penta Vacuum, Singapore.

Figure 12:
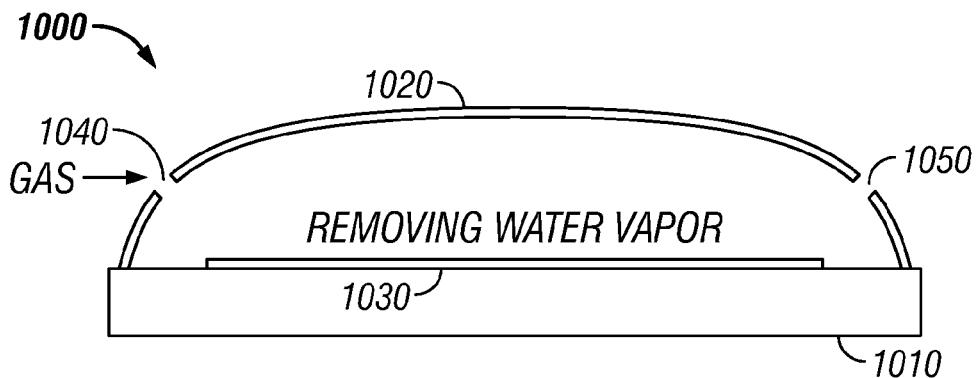
FIG. 12 is a schematic view showing a process of removing water vapor from the package according to another embodiment.

FIG. 12 is a schematic diagram showing a process of removing water vapor from the interior of the package according to another embodiment. In this embodiment, instead of sealing a backplate to the transparent substrate with a seal to encapsulate the interferometric modulator, a thin film 1020 is instead deposited over the transparent substrate 1010 and a sacrificial layer formed over the interferometric modulator array 1030. No separate seal is required in this embodiment. Instead, the inlet 1040 and outlet 1050 are formed in the thin film Backplate 1020, as shown in FIG. 12. It will be understood that the sacrificial layer needs to be removed to create a cavity below the Backplate 1020. To remove the sacrificial layer, a release material, such as xenon difluoride ($XeF_2$), may be introduced through an opening 1040, 1050 in the thin film 1020 into the interior of the package structure 1000 to remove the sacrificial layer. After removing the sacrificial layer, the water vapor inside the package may be removed using the methods described above. A package structure having a thin film backplate is described in U.S. patent application Ser. No. 11/045,738, filed Jan. 28, 2005, which is hereby incorporated herein in its entirety.

Figure 13:
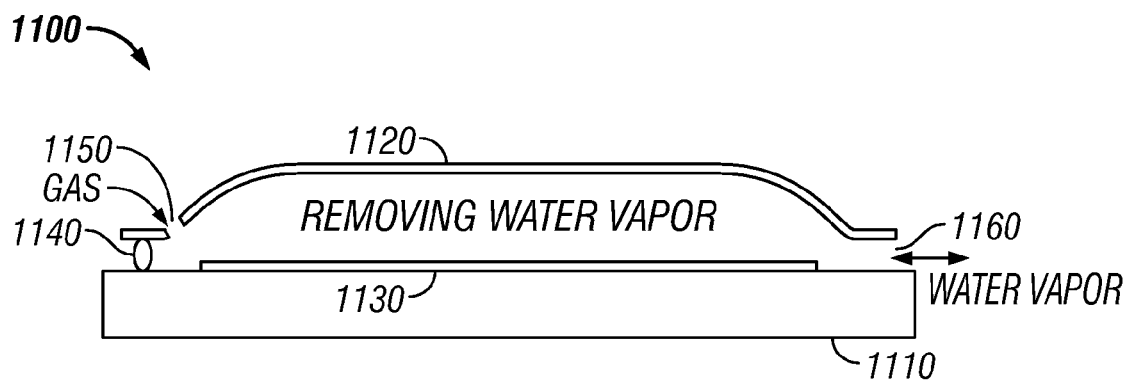
FIG. 13 is a schematic view showing a process of removing water vapor from the package according to still embodiment.

FIG. 13 is a schematic diagram showing a process of removing water vapor from a package 1100 according to another embodiment. In this embodiment, an inlet 1150 is formed in the backplate 1120 rather than in the seal 1140. As discussed above, since the backplate 1120 is formed of a material, such as glass, metal, or flexible polymer, the inlet 1150 can be effectively created in the backplate 1120 with the use of a scriber or laser, for example. An outlet 1160 may be formed in the seal 1140 by dispensing a non-continuous seal, as shown in FIG. 13. Gas may be fed into the package 1100 through the inlet 1150 to remove water vapor and/or unwanted material. Alternatively, it will be understood that the inlet may be formed in the seal and the outlet may be formed in the backplate.

Figure 14:
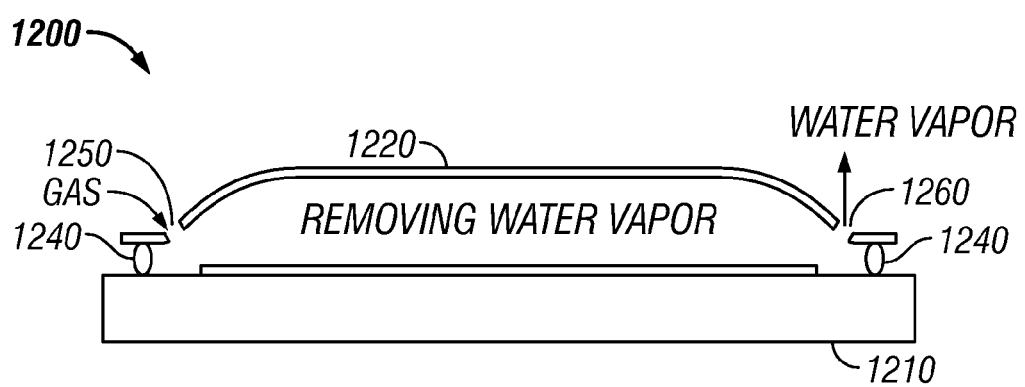
FIG. 14 is a schematic view showing a process of removing water vapor from the package according to yet another embodiment.

FIG. 14 is a schematic diagram showing a package configuration for removing water vapor from a package 1200 according to another embodiment. In this embodiment, both the inlet 1250 and the outlet 1260 are formed in the backplate 1220 and not in the seal 1240, as shown in FIG. 13. Once the inlet 1250 and outlet 1260 are formed, gas may be fed into the package 1200 to remove water vapor and/or unwanted material. It will be understood that the inlet 1250 and outlet 1260 maybe be formed in the backplate 1220 during the fabrication process for the backplate 1220.

Figure 15:
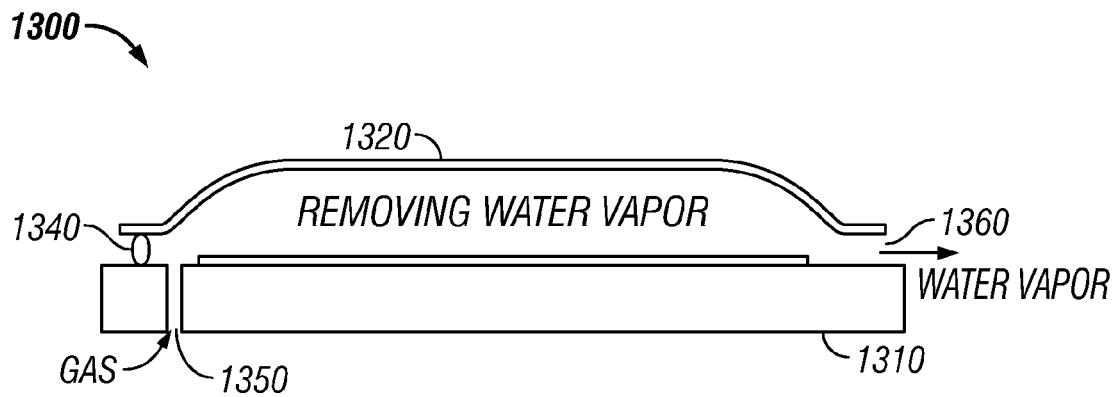
FIG. 15 is a schematic view showing a process of removing water vapor from the package according to yet another embodiment.

FIG. 15 is a schematic diagram showing a package configuration for removing water vapor from a package 1300 according to yet another embodiment. In this embodiment, an inlet 1350 is formed in the transparent substrate 1310 and the outlet 1360 is formed in the seal 1340 by dispensing a non-continuous seal, as shown in FIG. 15. As discussed above, since the transparent substrate 1310 is formed of a material, such as, for example, glass, plastic, or polymer, the inlet 1350 can be effectively defined in the transparent substrate 1310 with the use of a scriber or a laser, for example. Once the inlet 1350 and outlet 1360 are formed, gas may be introduced into the package 1300 to remove water vapor from the interior of the package.

Figure 16A:
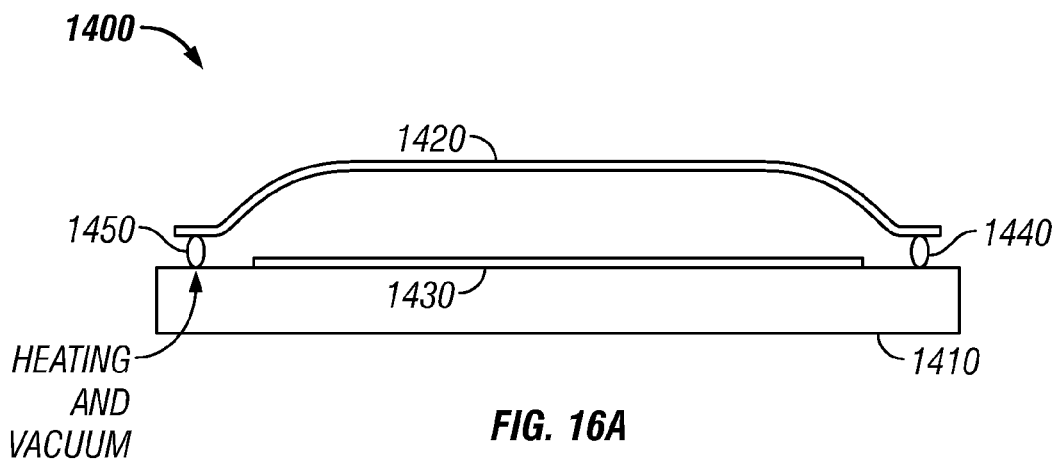
FIGS. 16A-16C are schematic views showing a process of removing water vapor from the package according to yet another embodiment.
Figure 16B:
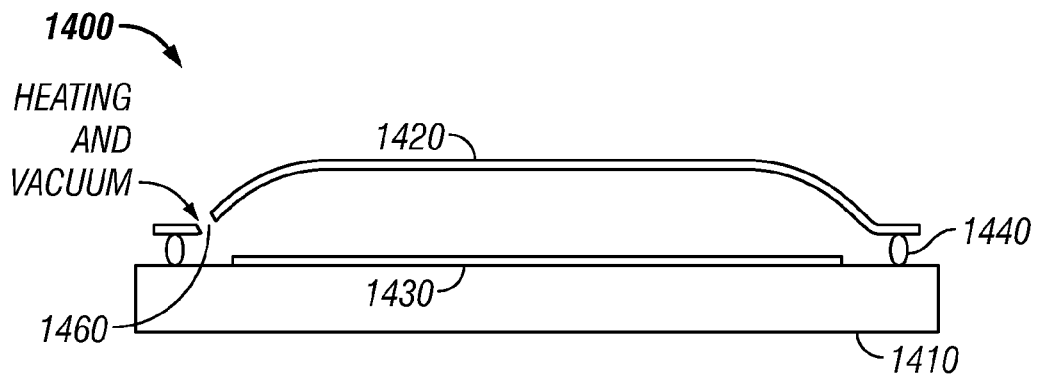
Figure 16C:
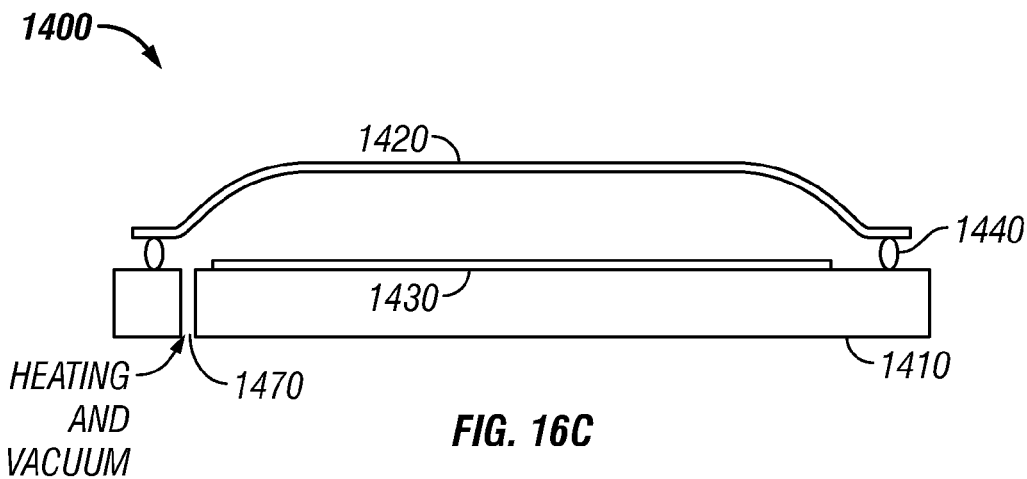

FIGS. 16A-16C are schematic diagrams showing a process of removing water vapor from a package 1400 according to another embodiment. In this embodiment, only one opening is formed in the package 1400. As shown in FIG. 16A, the opening 1450 may be formed in the seal 1440. Alternatively, as shown in FIG. 16B, the opening 1460 may be formed in the backplate 1420. In another embodiment, as shown in FIG. 16C, the opening 1470 may be formed in the transparent substrate 1410. In these embodiments, heated air or a heated gas may be introduced into the package 1400 to dry the water vapor within the package 1400. Once the heated gas is supplied to the interior of the package 1400, vacuuming may also be performed to draw out any remaining water vapor from the interior of the package 1400. It will be understood that the opening 1450, 1460, 1470 can also be used to inject desiccant, a release material, or self-aligning monolayer, as described in detail above.

Figure 17A:
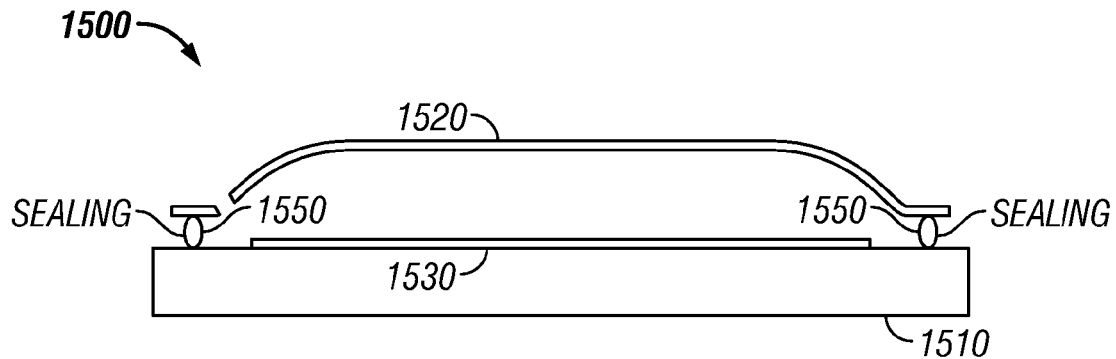
FIG. 17A is a schematic view showing a process of sealing openings according to an embodiment.
Figure 17B:
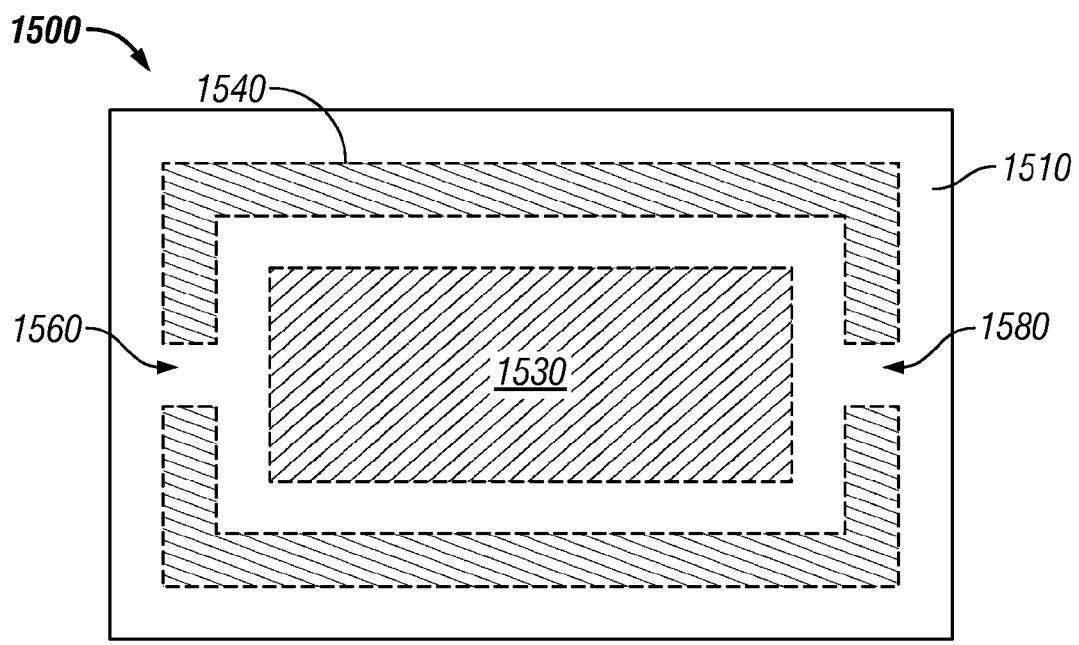
FIG. 17B is a top plan view of the embodiment shown in FIG. 17A prior to sealing the openings.

FIGS. 17A and 17B are cross-sectional and top view diagrams, respectively, showing sealing openings 1550 in a package 1500, according to an embodiment. After the water vapor and/or unwanted material is substantially or completely removed from the interior of the package 1500, openings 1550 may be sealed to form an endseal. Prior to sealing, the openings 1550 in the seal are formed by dispensing a non-continuous seal 1540. In the embodiment shown in FIG. 17A, openings 1550 in the seal 1540 are sealed with the same material that forms the perimeter seal 1540. It will be understood that although FIG. 17A shows a sealing process for a package having openings in the seal 1540, the same or a similar sealing process can be performed for other embodiments. For example, openings in a backplate may be sealed with the same material that forms the backplate. Alternatively, openings in a transparent substrate may be sealed with the same material that forms the transparent substrate. The skilled artisan will appreciate that the openings may be sealed with alternative materials, including, but not limited to, thermally or UV cured epoxies, having a low viscosity, welds, solders, metal caps, and glass caps.

Generally, the packaging process, including an endseal process, may be accomplished in a vacuum, pressure between a vacuum up to and including ambient pressure, or pressure higher than ambient pressure. The packaging process may also be accomplished in an environment of varied and controlled high or low pressure during the sealing process. There may be advantages to packaging the interferometric modulators in a completely dry environment, but it is not necessary.

As discussed above, an opening in the backplate or perimeter seal during the sealing process maintains equivalent pressure within the package structure and outside the package structure. The packaging environment may be of an inert gas at ambient conditions. Packaging at ambient conditions allows for a lower cost process because it provides more potential for versatility in equipment choice and because the device may be transported through ambient conditions without affecting the operation of the device.

Packaging MEMS Devices in an LCD-type Process

In a typical LCD manufacturing process, a front glass plate and a rear glass plate are sandwiched together to create an LCD display. Normally, the front glass plate and the rear glass plate are produced in different production lines. In an LCD assembly machine, the two glass plates are aligned, combined and fixed together, normally using thermally curable epoxy. Then the glass panels are pressed together and heated in order to cure the seals and create a stable panel structure. The glass panels are then scribed and broken to the final display dimensions. A single set of front and rear glass plates can be used to produce several individual display panels by scribing and breaking the plates once they are sealed together. An opening in the seal is provided so the two plates can be brought in close proximity without a resultant build-up of internal air pressure within the interior of the plate sandwich. In addition, the opening provides a way to introduce the liquid crystal material between the glass plates. The edges are ground and the singularized displays are filled with liquid crystal liquid and the opening in the seal is then closed using UV curable polymer.

In one embodiment of the invention, this type or another similar type of process can be advantageously adapted to the packaging of other types of display products, such as interferometric modulator displays. For example, a first glass plate having a set of interferometric modulator arrays can be provided. A thermally curable or UV curable polymer material can be screen printed around the outer circumference of each array. A second glass plate can then be pressed against the first glass plate and heated to cure the seal between each array. The arrays can then be scribed and broken apart into individual display components.

Some embodiments include a variety of methods for overcoming the problems associated with air pressure building up between the glass plates as they are sandwiched together. For example, the thermally curable or UV curable polymer can be printed in around each array, however a small gap can be left to provide an air passage between the interior of the array and the external environment. After the glass plates have been sealed together, the gap can thereafter be sealed to protect the interior of the array from the external environment using, for example, a UV curable polymer, similar to LCD packaging. As discussed above, water vapor in the air can cause mirrors within the modulator array to stick and not function properly. Thus, sealing the small gap left in the polymer will prevent ambient water vapor from entering the interior of the modulator array.

In one embodiment, a desiccant is introduced between the glass plates, in a method similar to introduction of the liquid crystal solution between glass panels in an LCD display. If a gap is left open from the external environment to the interior of each modulator array, a low-viscosity liquid polymer with incorporated desiccant can be introduced between the glass panels and allowed to flow inside of each modular array. The low viscosity liquid polymer with desiccant can comprise any of the desiccants described above, including calcium oxide, strontium oxide (SrO), silica gels, montmorillonite clay (e.g. a magnesium aluminum silicate), molecular sieves (zeolites), calcium sulfates, or a combination thereof. In one embodiment, the low-viscosity liquid desiccant comprises a UV curable epoxy filled with desiccant material.

In some embodiments, a series of orifices can be provided in either glass plate so that the air pressure does not build up inside the devices as the glass plates are brought together to form the package. For example, the first glass plate may provide the interferometric modulator arrays and the thermally curable or UV curable polymer circumscribing each array. The second glass plate may include a series of small orifices configured to be positioned opposite each array as the two glass plates are sandwiched together. Once the plates are sandwiched together to form a package, the orifices in the second glass plate can be sealed by a method, such as is described above. After the thermally curable or UV-curable polymer has hardened, the arrays can be separated, for example, by scribing and braking apart to provide individual modulator arrays.

Figure 18:
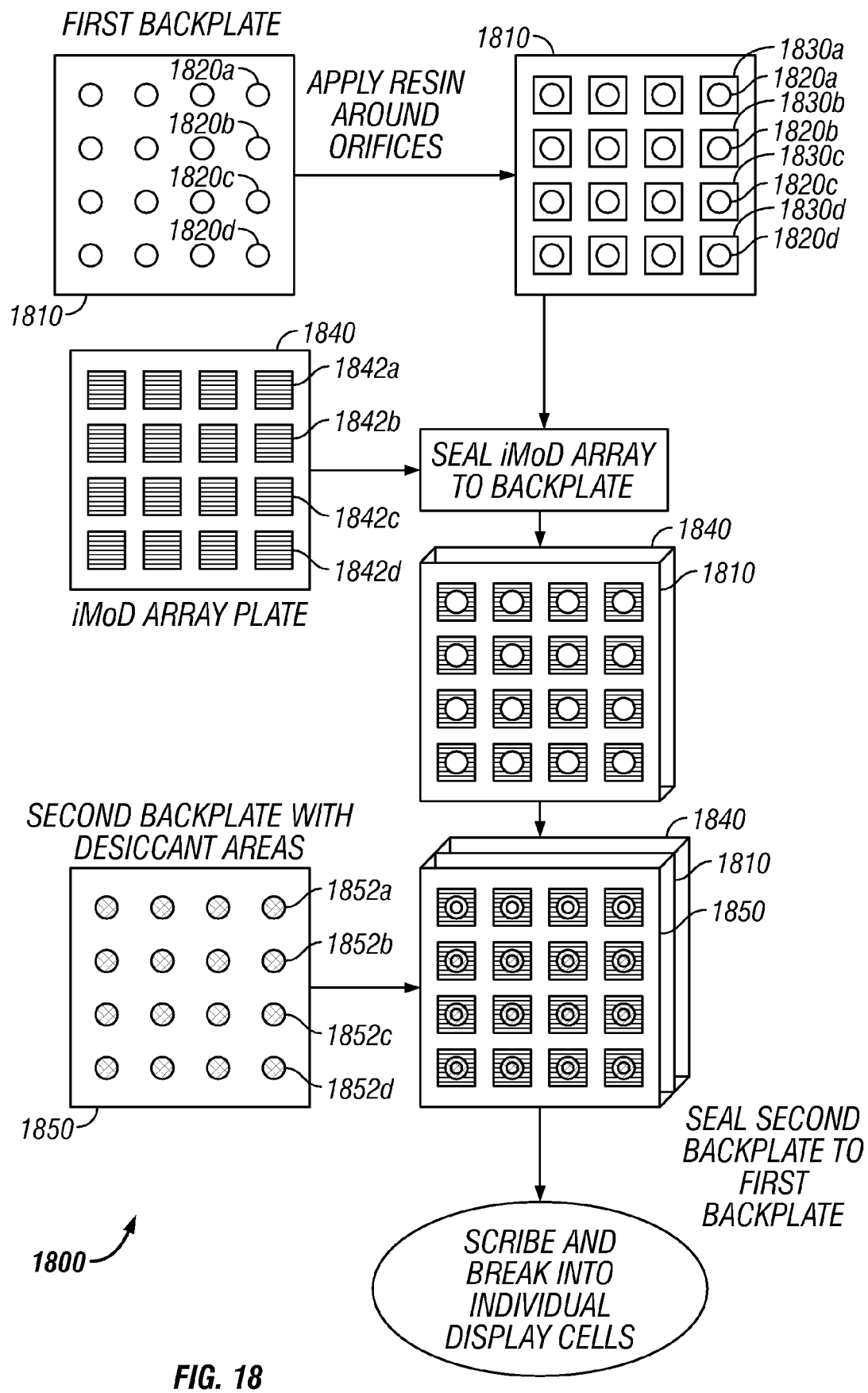
FIG. 18 is a flow diagram illustrating one embodiment of a process for manufacturing MEMS devices, such as interferometric modulators.

One embodiment of a process 1800 for manufacturing a MEMS device is shown in FIG. 18. As illustrated, a first backplate 1810 is provided with a series of orifices 1820A-D. The first backplate may be, for example, approximately 0.3 mm thick. A resin 1830A-D is applied through silk screening, inkjet, or another technology, to circumscribe each orifice 1820A-D. In one embodiment, the resin is approximately 4-12 μm in height and 0.7-1 mm in width.

An iMoD array plate 1840, having a series of interferometric modulator arrays 1842A-D is then aligned and sealed to the first backplate 1810. It should be noted that the resin 1830A-D is configured so that when the first backplate 1810 is sealed to the iMoD array plate 1840, the resin provides an airtight seal around the outer periphery of each modulator array 1842A-D. In one embodiment, the resin is a UV-curable sealant. In another embodiment, the resin is thermal glue that is cured by baking the glass plates. For example, the thermal glue may be an acrylic epoxy type which is baked in an oven at, for example, approximately 160° C. to be cured.

Because the first backplate comprises a series of orifices 1820A-D, there would be no air pressure built up when the two plates are brought together. Any air pressure that would normally be built up between the plates would escape through the orifices 1820A-D into the ambient environment.

Once the first backplate 1810 has been sealed to the iMoD array plate 1840, a second backplate 1850 is sealed to the first Backplate 1810. The second backplate 1850 may be, for example, approximately 0.4 mm thick. Thus, the combination of the first and the second backplates creates a dual-backplate structure of, for example, approximately 0.7 mm in thickness. As indicated, the second backplate 1850 contains desiccant areas 1852A-D which are configured to align with the orifices 1820A-D in the first backplate. When the second backplate 1850 is sealed to the sandwich created by the first backplate 1820 and the iMoD array plate 1840, the desiccant areas 1852A-D are adjacent the interferometric modulators 1842A-D. The position of these components with respect to one another will be described in more detail with reference to cross-sectional FIG. 19.

After the second backplate 1850 is sealed to the first backplate 1810, the final three-layered display panel is scribed and broken into individual display cells for further processing.

It should be realized that the iMoD array plate 1840 may contain either released or unreleased interferometric modulators. If the interferometric modulators are not released, then a release gas may be used to release the iMoDs 1842A-D after they iMoD array plate 1840 has been sealed to the first backplate 1810. Because the first backplate 1810 includes orifices 1820A-D, the release gas can contact the individual arrays 1842A-D even after the sandwich between the plates 1810 and 1840 has been created. This provides an advantage in that the thermal processing required to seal the plates 1810 and 1840 together may be harmful to unreleased components. Accordingly, using this process, the interferometric modulators may remain unreleased until after the thermal bonding step has been completed.

In addition, the size and pattern of the desiccant illustrated in FIG. 18 is not limiting on the invention. Desiccant areas of virtually any size or shape that help absorb moisture from the interior of the interferometric modulator array are anticipated to work similarly.

Figure 19:
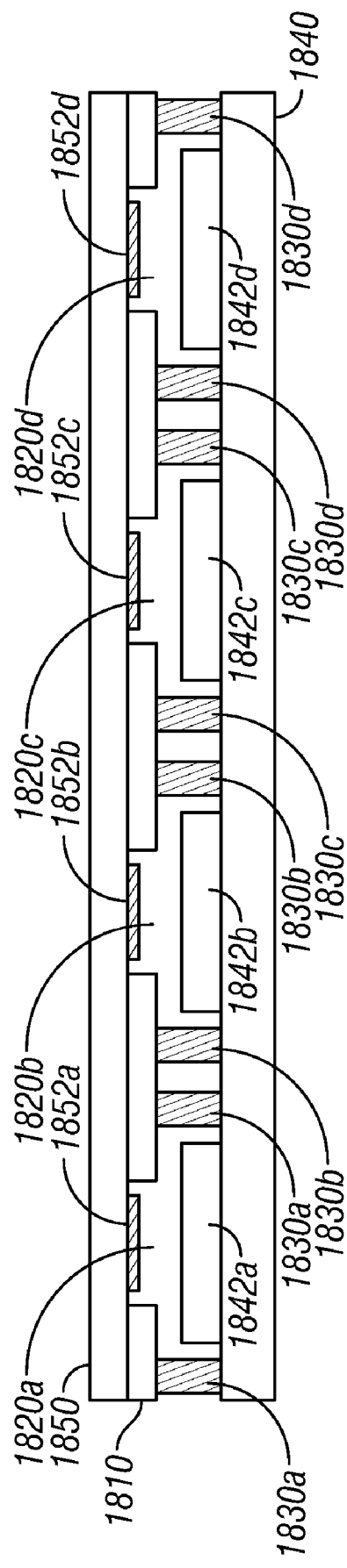
FIG. 19 is a cross-sectional view of an panel of interferometric modulator arrays having a double layered backplate.

FIG. 19 shows a cross sectional view of the triple layer sandwich created by the plates 1840, 1810 and 1850. As can be seen, the lower plate 1840 includes the interferometric modulator arrays 1842A-D. Opposite the arrays 1842A-D are orifices 1820A-D, and exposed through the orifices are desiccant areas 1852A-D from the second backplate 1850. The resin 1830A-D seals each modulator array 1842A-D from each other array. In one embodiment, the resin provides a fully hermetic seal between the arrays.

In one alternative embodiment, the first backplate 1810 and the second backplate 1850 are sealed together prior to contacting the iMoD array plate 1840. In this embodiment, a small opening is left in the resin layer 1820A-D in order to prevent air pressure from building up when the two backplate layers are sealed to the array plate 1840. Once the backplate layers are sealed to the array plate 1840, the openings in the resin layer 1820A-D can be sealed with additional resin or adhesive.

Figure 20A:
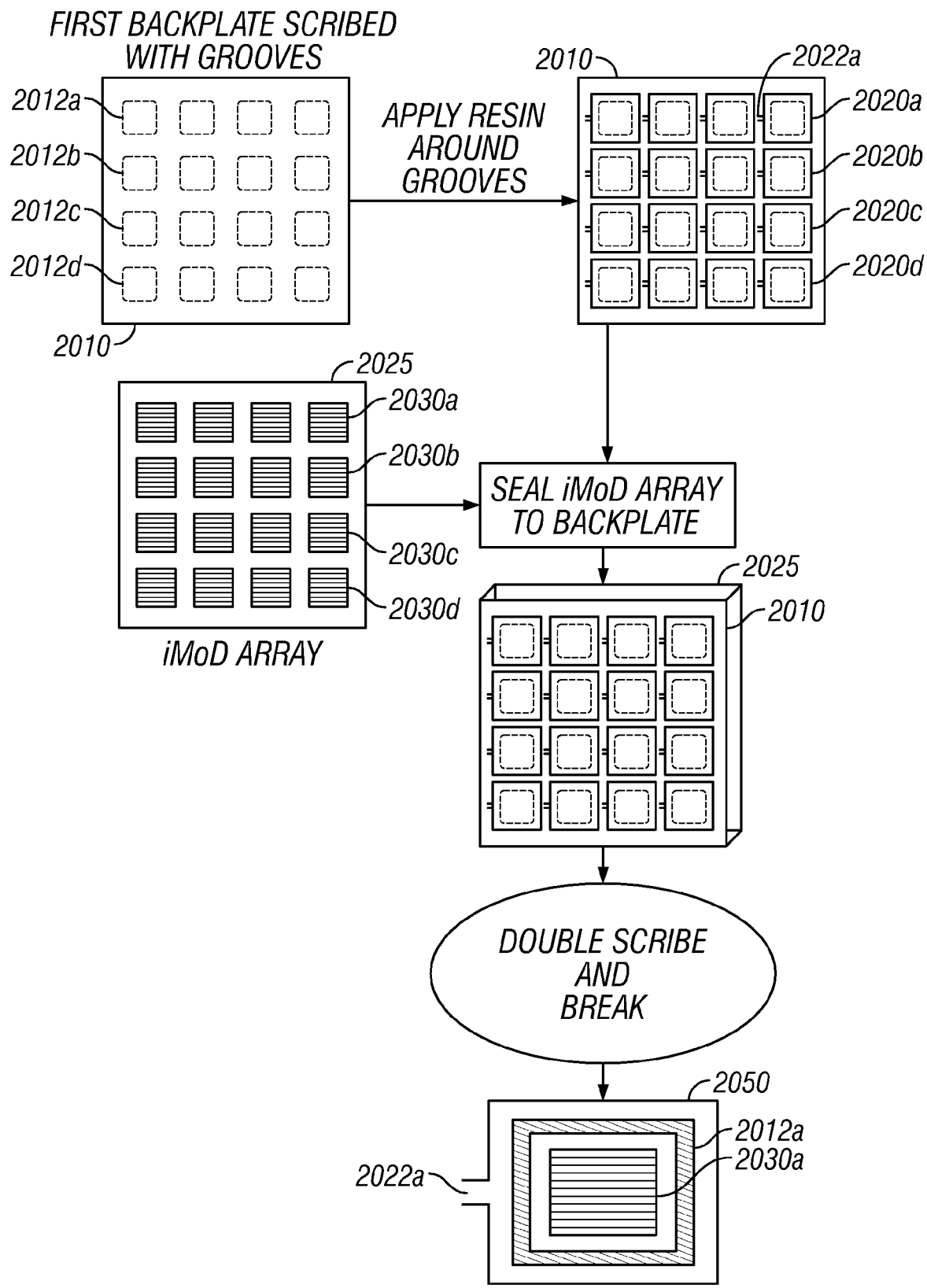
FIG. 20A is a flow diagram illustrating one embodiment of a process for manufacturing MEMS devices, such as interferometric modulators, wherein a groove is formed on a backplate.
Figure 20B:
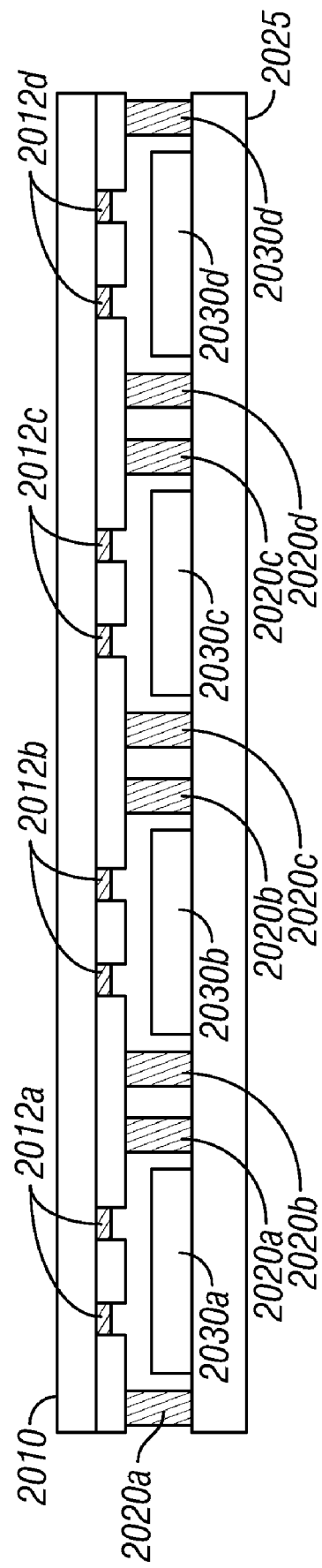
FIG. 20B is a cross-sectional view of a panel of interferometric modulator arrays having a groove formed on a backplate.

Referring now to FIG. 20A, an additional embodiment of a process for packaging MEMS devices is described. As shown, a backplate 2010 is provided having a series of grooves 2012A-D. In the embodiment shown, the grooves 2012A-D are in a square configuration. The grooves can be created by, for example, mechanical scribing or chemical etching or sandblasting a channel in the backplate 2010 in the desired pattern. A series of resin patterns 2020A-D are then applied along the outer circumference of the grooves 2012A-D. A small opening 2022A is left in each of the resin patterns to allow air to flow out from the device as it is packaged.

An iMoD array plate 2025 having a set of interferometric modulator arrays 2030A-D is then aligned and adhered to the backplate 2010 to form a package by curing the resin 2020A-D in a manner similar to that described in the process of FIG. 18. As can be envisioned, each iMoD array 2030A-D is aligned opposite each of the respective grooves 2012A-D. The resin layer 2020A-D seals each modulator array 2030A-D from the external environment, with the exception of a small opening.

A liquid desiccant can be, for example, a very low viscosity UV epoxy mixed with calcium oxide powder (CaO). This liquid desiccant can then be flowed into each array package through the small opening 2022A in the resin 2020A-D. In one embodiment, the sandwich formed by the plates 2010 and 2025 is scribed and broken into individual array panels 2050 prior to addition of the liquid desiccant. As the interior of each modulator array fills with liquid desiccant, the grooves 2012A-D will also fill with desiccant to provide a fairly thick circumference of desiccant just on the interior edge of the resin layer. The small opening in the resin layer can then be sealed to prevent the desiccant from flowing back out of the array package. Also, a UV epoxy filled with desiccant can be UV cured to lock-in the desiccant in place. This also would prevent the ambient environment from entering the interior of the array package.

As shown in cross-sectional view 20B, the modulator array plate 2025 includes a series of interferometric modulators 2030A-D which are disposed opposite the backplate 2010. The backplate 2010 has a series of grooves 2012A-D which are carved into the backplate 2010. A resin layer 2020A-D separates each modulator array from the other arrays.

Figure 21:
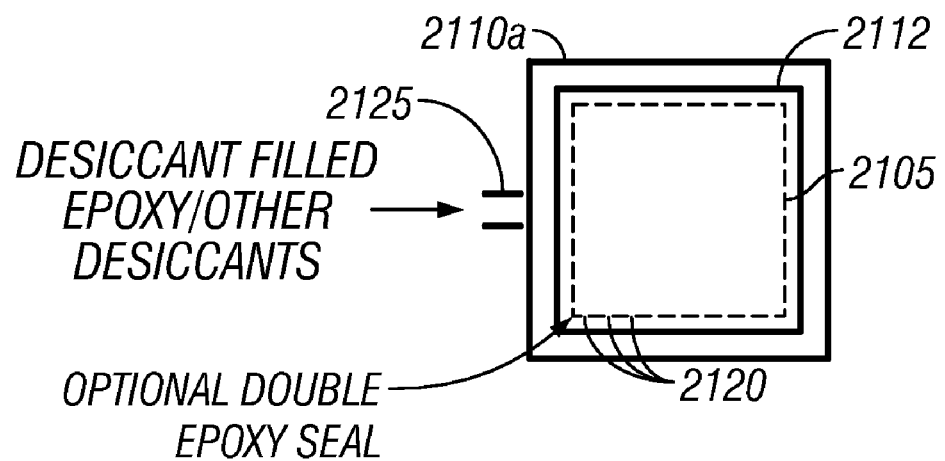
FIG. 21 is one embodiment of a MEMS display device package, where the package has two sealant layers.

In a related embodiment shown in FIG. 21, the backplate 2010 may be layered with two or more layers of resin. For example an inner layer of resin 2105 on the interior of groove 2112 may be provided. In addition, an outer resin layer 2110 may be provided on the exterior of the groove 2112. In this embodiment, the inner layer of resin 2105 may have very small air permeable openings 2120 that would allow escape of increasing air pressure, but would not allow a liquid desiccant to flow into the inner portion of the modulator array package. Thus, when the liquid desiccant is flowed through an opening 2125 in the outer layer of resin 2110 it will fill the groove 2112, but not flow over the actual modulator array. This would prevent the modulator array from being damaged by the liquid desiccant or any byproducts of the desiccant.

Figure 22:
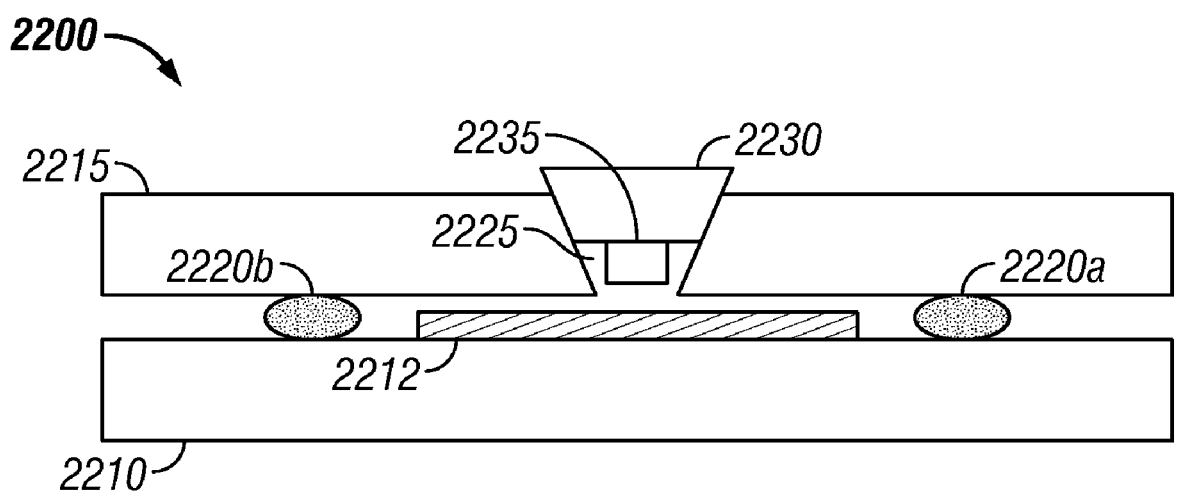
FIG. 22 is a cross-sectional view of one embodiment of an interferometric modulator array package, wherein a plug is used to seal an orifice in a backplate.

FIG. 22 shows another embodiment of a MEMS device 2200 that can be made by a LCD compatible process. A first plate 2210 having an interferometric modulator array 2212 is shown. The substrate is sealed to a backplate 2215 by sealants 2220A and 2220B. The backplate 2215 contains a tapered orifice 2225 which can be used to allow air to escape while the two plates 2210 and 2215 are brought together and sealed. A tapered plug 2230, having a desiccant tip 2235 is used to fill the orifice 2225 once the plates 2210 and 2215 are sealed together. The tapered plug can be a small piece of glass, or other material such as metal or ceramic. In practice the tapered plug would be glued into place using an epoxy or other sealant as described above. Although only one array is illustrated in FIG. 22, it should be realized that the process of making the device 2200 can start from a plate of several arrays, as described in FIG. 18. At the end of that process, the individual arrays can be scribed and separated from the other arrays on the plate.

In another embodiment shown in FIG. 23A, a MEMS package 2300 is formed using four glass spacers 2310A-D. As shown, the spacers 2310A-D fit together to form a frame around an interferometric modulator array 2325. An epoxy bond 2330 holds the four spacers 2310A-D together in the frame configuration. The epoxy bond 2330 may, for example, be a thermally curable or UV curable epoxy. As shown, the frame has four corners 2333A-D which provide an air permeable passageway between the spacers from the ambient environment to the interior of a package formed around the modulator array 2325.

As can be seen more clearly in a cross-sectional FIG. 23B of the MEMS package 2300, the four glass spacers 2310A-D bond to a transparent substrate 2350. The transparent substrate 2350 supports the interferometric modulator array 2325. The spacers support a glass backplate 2355 which includes a desiccant 2360. During manufacture, the corners 2333A-D initially function as crevices for excessive air pressure when the backplate 2355 with desiccant 2360 is attached. Thus, the edge crevices prevent air pressure from building up within the package during the step of joining the transparent substrate 2350 to the backplate 2355. Later the edge crevices between the spacers can be sealed by a resin.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A microelectromechanical systems (MEMS) based device, comprising:
   a transparent substrate having a MEMS device formed thereon;
   a first backplate sealed to said transparent substrate, the first backplate comprising at least one orifice; and
   a second backplate joined to said first backplate, and comprising at least one desiccant area, wherein said at least one desiccant area is exposed to said MEMS device through said at least one orifice.

2. The device of claim 1, wherein said transparent substrate comprises glass.

3. The device of claim 1, wherein said first backplate comprises glass.

4. The device of claim 1, wherein the second backplate comprises glass or metal.

5. The device of claim 1, wherein the MEMS device comprises an interferometric modulator.

6. The device of claim 1, further comprising:
   a processor that is in electrical communication with said microelectromechanical systems device, said processor being configured to process image data; and a memory device in electrical communication with said processor.

7. The device of claim 6, further comprising a driver circuit configured to send at least one signal to said microelectromechanical systems device.

8. The device of claim 7, further comprising a controller configured to send at least a portion of said image data to said driver circuit.

9. The device of claim 6, further comprising an image source module configured to send said image data to said processor.

10. The device of claim 9, wherein said image source module comprises at least one of a receiver, transceiver, and transmitter.

11. The device of claim 6, further comprising an input device configured to receive input data and to communicate said input data to said processor.

12. A microelectromechanical systems (MEMS) based device, comprising:
   means for supporting a MEMS device, having the MEMS device formed thereon;
   first means for sealing comprising at least one orifice; and
   second means for sealing joined to said first sealing means, and comprising at least one desiccant area, wherein said at least one desiccant area is exposed to said MEMS device through said at, least one orifice.

13. The device of claim 12, wherein the supporting means comprises a transparent substrate.

14. The device of claim 12, wherein the first sealing means comprises a first backplate.

15. The device of claim 12, wherein the second sealing means comprises a second backplate.

16. The device of claim 12, wherein said supporting means comprises glass.

17. The device of claim 12, wherein said first sealing means comprises glass.

18. The device of claim 12, wherein the second sealing means comprises glass.

19. The device of claim 12, wherein the MEMS device comprises an interferometric modulator.

20. The device of claim 12, further comprising:
   a processor that is in electrical communication with said microelectromechanical systems device, said processor being configured to process image data; and
   a memory device in electrical communication with said processor.

21. The device of claim 20, further comprising a driver circuit configured to send at least one signal to said microelectromechanical systems device.

22. The device of claim 21, further comprising a controller configured to send at least a portion of said image data to said driver circuit.

23. The device of claim 20, further comprising an image source module configured to send said image data to said processor.

24. The device of claim 23, wherein said image source module comprises at least one of a receiver, transceiver, and transmitter.

25. The device of claim 20, further comprising an input device configured to receive input data and to communicate said input data to said processor.

* * * * *

UNITED STATES PATENT AND TRADEMARK OFFICE
CERTIFICATE OF CORRECTION

PATENT NO. : 7,746,537 B2
APPLICATION NO. : 11/734730
DATED : June 29, 2010
INVENTOR(S) : Bangalore R. Natarajan et al.

It is certified that error appears in the above-identified patent and that said Letters Patent is hereby corrected as shown below:

Title Pg, Item (56) Other Publications:

At page 3, Column 2, Line 60, change "PCT/US071009275" to --PCT/US07/009275--.

At Column 15, Line 35, change "scaling" to --sealing--.

At Column 25, Line 26, Claim 12, change "at," to --at--.

Signed and Sealed this
Seventh Day of June, 2011

David J. Kappos
*Director of the United States Patent and Trademark Office*